(12) United States Patent
Tak et al.

(10) Patent No.: US 12,127,428 B2
(45) Date of Patent: Oct. 22, 2024

(54) DISPLAY DEVICE

(71) Applicant: Samsung Display Co., Ltd., Yongin-si (KR)

(72) Inventors: Kyung Seon Tak, Hwaseong-si (KR); Young Gu Kim, Yongin-si (KR); Ji Yun Park, Hwaseong-si (KR); Bong Sung Seo, Suwon-si (KR); Jong Ho Son, Seoul (KR); Yeon Hee Lee, Asan-si (KR); Baek Kyun Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 498 days.

(21) Appl. No.: 17/445,114

(22) Filed: Aug. 16, 2021

(65) Prior Publication Data

US 2022/0140289 A1    May 5, 2022

(30) Foreign Application Priority Data

Nov. 3, 2020   (KR) .................. 10-2020-0145178

(51) Int. Cl.
*H10K 50/858*    (2023.01)
*H10K 59/122*    (2023.01)

(52) U.S. Cl.
CPC ......... *H10K 50/858* (2023.02); *H10K 59/122* (2023.02)

(58) Field of Classification Search
CPC .. H10K 50/858; H10K 59/122; H10K 50/844; H10K 59/50; H10K 50/85; H10K 59/12; H10K 50/8426; G02B 3/0006
See application file for complete search history.

(56) References Cited

U.S. PATENT DOCUMENTS

2007/0176195 A1\*  8/2007  Kuiseko ............ G02F 1/133603
                                                                257/98
2019/0221778 A1\*  7/2019  Kim ..................... H10K 59/352

FOREIGN PATENT DOCUMENTS

| JP | 5365671 B2 | 12/2013 |
| KR | 10-2015-0004974 A | 1/2015 |
| KR | 10-2019-0081485 A | 7/2019 |
| KR | 10-2019-0087689 A | 7/2019 |
| KR | 10-2021-0031570 | 3/2021 |

\* cited by examiner

*Primary Examiner* — Mohammad M Choudhry
(74) *Attorney, Agent, or Firm* — Lewis Roca Rothgerber Christie LLP

(57) ABSTRACT

A display device includes: a substrate; a first electrode on the substrate; a bank layer on the first electrode; an organic light-emitting layer on the first electrode; a second electrode on the organic light-emitting layer and the bank layer; a high-refractive lens on the second electrode and having a refractive index higher than a refractive index of a material that overlaps the first electrode and contacts a side surface of the high-refractive lens; a display panel including an encapsulation member that is on the high-refractive lens; and an optical path adjustment film on the display panel. The optical path adjustment film includes a plurality of protruding patterns on the encapsulation member and a cover layer in spaces between adjacent protruding patterns from among the plurality of protruding patterns. A refractive index of each of the protruding patterns is smaller than a refractive index of the cover layer.

20 Claims, 24 Drawing Sheets

| CHARACTER | | DOUBLE IMAGES OF SIDE SURFACE (%) |
|---|---|---|
| FRONT | LEFT 45° | |
|  |  |  |
|  |  |  |

DISPLAY DEVICE

CROSS-REFERENCE TO RELATED APPLICATION

This application claims priority to and the benefit of Korean Patent Application No. 10-2020-0145178, filed on Nov. 3, 2020 in the Korean Intellectual Property Office (KIPO), the entire disclosure of which is incorporated by reference herein.

BACKGROUND

1. Field

The present disclosure relates to a display device.

2. Description of Related Art

Display devices are becoming increasingly important with the development of multimedia. In response to this, various suitable kinds of display devices such as a liquid crystal display device (LCD) and an organic light-emitting display device (OLED), and the like are being used.

Among the display devices, the OLED displays an image using an organic light-emitting element that generates light by recombination of electrons and holes. The OLED has relative advantages in that it has a quick response time, a high brightness, and a wide viewing angle, and simultaneously, the OLED is driven with low power consumption.

The display device includes an encapsulation member that covers the organic light-emitting element in order to protect the organic light-emitting element, but light generated from the organic light-emitting element may be totally reflected at an interface between the encapsulation member and the outside of the encapsulation member and trapped in a lower portion of the encapsulation member, so that overall light efficiency may be reduced.

SUMMARY

Aspects of one or more embodiments of the present disclosure are directed towards a display device capable of improving light emission efficiency and reducing a color change according to a viewing angle.

Aspects of the present disclosure are not limited to the aspects mentioned above, and other technical aspects not mentioned above will be clearly understood by those skilled in the art from the following description.

According to an embodiment, a display device includes a substrate; a first electrode on the substrate; a bank layer on the first electrode and partially exposing an upper surface of the first electrode; an organic light-emitting layer on the upper surface of the first electrode exposed by the bank layer; a second electrode on the organic light-emitting layer and the bank layer; a high-refractive lens on the second electrode and having a refractive index higher than a refractive index of a material that overlaps the first electrode in a thickness direction of the display device and contacts a side surface of the high-refractive lens; a display panel including an encapsulation member that faces the substrate, is on the high-refractive lens, and seals the organic light-emitting layer; and an optical path adjustment film on the display panel. The optical path adjustment film includes a plurality of protruding patterns on the encapsulation member and a cover layer in spaces between adjacent protruding patterns from among the plurality of protruding patterns. A refractive index of each of the protruding patterns is smaller than a refractive index of the cover layer (e.g., each of the protruding patterns is smaller in refractive index than the cover layer).

The high-refractive lens may include a lower surface, an upper surface closer to the encapsulation member than the lower surface, and the side surface connecting the lower surface and the upper surface. A width of the upper surface of the high-refractive lens may be larger than a width of the lower surface of the high-refractive lens. The side surface of the high-refractive lens may be inclined downward.

The refractive index of the high-refractive lens may be 1.4 to 2.0.

An inclination angle formed by the upper surface and the side surface of the high-refractive lens may be 44° to 60°.

The material contacting the side surface of the high-refractive lens may be air.

The high-refractive lens may include high refractive curable polysilicon.

A thickness from the upper surface of the high-refractive lens to the lower surface of the high-refractive lens may be 1 μm to 30 μm.

A cross-sectional shape of the high-refractive lens may include an inverted trapezoidal shape.

A planar shape of the upper surface of the first electrode exposed by the bank layer may be the same as a planar shape of the high-refractive lens.

The plurality of protruding patterns may include a protruding pattern including an upper surface, a lower surface closer to the encapsulation member than the upper surface, and a side surface connecting the upper surface and the lower surface. A width of the upper surface of the protruding pattern may be smaller than a width of the lower surface of the protruding pattern. The side surface of the protruding pattern may be inclined downward.

The cover layer may be in direct contact with the upper surface of the protruding pattern and the side surface of the protruding pattern.

A difference in the refractive indices between the cover layer and the protruding pattern may be 0.12 to 0.2.

The width of the upper surface of the protruding pattern may be 5 μm to 7 μm. A pitch of the adjacent protruding patterns may be 10 μm to 30 μm.

A randomness of the pitch of the plurality of protruding patterns may be 20% to 50%.

A ratio of the width of the upper surface of the protruding pattern and a thickness from the upper surface of the protruding pattern to the lower surface of the protruding pattern may be 1.0 to 1.5.

An inclination angle formed by the lower surface of the protruding pattern and the side surface of the protruding pattern may be 80° to 89°.

According to another embodiment, a display device includes a substrate; a first electrode on the substrate; a bank layer on the first electrode and partially exposing an upper surface of the first electrode to define a pixel area; an organic light-emitting layer on the first electrode in the pixel area; a second electrode on the organic light-emitting layer and the bank layer; a high-refractive lens on the second electrode and having a refractive index higher than a refractive index of a material that overlaps the first electrode in a thickness direction of the display device and contacts a side surface of the high-refractive lens; a display panel including an encapsulation member that faces the substrate, is on the high-refractive lens, and includes a glass sealing the organic light-emitting layer; and an optical path adjustment film on the display panel and including a plurality of protruding patterns on the encapsulation member and a cover layer that is provided in a space between adjacent protruding patterns from among the plurality of protruding patterns and has a refractive index greater than a refractive index of each of the protruding patterns. The high-refractive lens overlaps the plurality of protruding patterns in the thickness direction.

The high-refractive lens may include a lower surface, an upper surface closer to the encapsulation member than the lower surface, and the side surface connecting the lower surface and the upper surface. A width of the upper surface of the high-refractive lens may be larger than a width of the lower surface of the high-refractive lens. The side surface of the high-refractive lens may be inclined downward. The refractive index of the high-refractive lens may be 1.4 to 2.0. An inclination angle formed by the upper surface of the high-refractive lens and the side surface of the high-refractive lens may be 44° to 60°. The material contacting the side surface of the high-refractive lens may be air.

The plurality of protruding patterns may include a protruding pattern including an upper surface, a lower surface closer to the encapsulation member than the upper surface, and a side surface connecting the upper surface and the lower surface. A width of the upper surface of the protruding pattern may be smaller than a width of the lower surface of the protruding pattern. The side surface of the protruding pattern may be inclined downward. The cover layer may be in direct contact with the upper surface of the protruding pattern and the side surface of the protruding pattern. A difference in the refractive indices between the cover layer and the protruding pattern may be 0.12 to 0.2.

The plurality of protruding patterns may laterally guide light generated from the organic light-emitting layer in the pixel area.

Additional details according to one or more embodiments of the present disclosure are included in the following Detailed Description and drawings.

DETAILED DESCRIPTION

Figure 1:
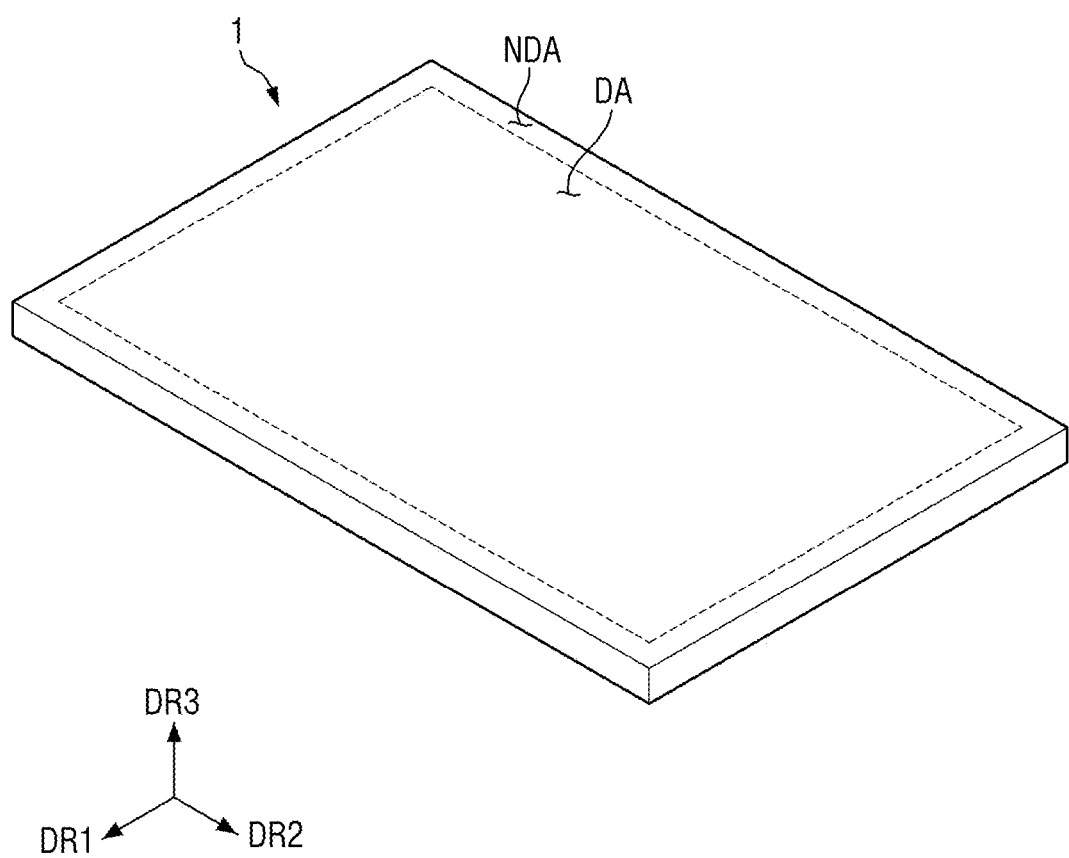
FIG. 1 is a perspective view of a display device according to an embodiment.

Specific structural and functional descriptions of embodiments of the present disclosure disclosed herein are only for illustrative purposes of the embodiments of the present disclosure. The present disclosure may be embodied in many different forms without departing from the spirit and scope of the present disclosure. Therefore, the embodiments of the present disclosure are disclosed only for illustrative purposes and should not be construed as limiting the present disclosure. That is, the present disclosure is defined by the scope of the claims and equivalents thereof.

It will be understood that when an element is referred to as being related to another element such as being "coupled" or "connected" to another element, it can be directly coupled or connected to the other element or one or more intervening elements may be present therebetween. In contrast, it should be understood that when an element is referred to as being related to another element such as being "directly coupled" or "directly connected" to another element, there are no intervening elements present. Other expressions that describe the relationship between elements, such as "between," "directly between," "adjacent to," or "directly adjacent to," should be construed in the same way.

Throughout the specification, the same reference numerals may refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" may refer to "at least one element," unless the context clearly indicates otherwise. "At least one" is not to be construed as limiting "a" or "an." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

Furthermore, relative terms, such as "lower" or "bottom" and "upper" or "top," may be used herein to describe one element's relationship to another element as illustrated in the drawings. It will be understood that spatially relative terms are intended to encompass different orientations of the device in addition to the orientation depicted in the drawings. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

As used herein, the term "substantially," "about," and similar terms are used as terms of approximation and not as terms of degree, and are intended to account for the inherent deviations in measured or calculated values that would be recognized by those of ordinary skill in the art. "About" or "approximately" as used herein is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" can refer to within one or more standard deviations, or within ±30%, 20%, 10% or 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

FIG. 1 is a perspective view of a display device according to an embodiment.

Referring to FIG. 1, a planar shape of a display device 1 has a rectangular shape with angled corners including short sides extending along a first direction DR1 and long sides extending along a second direction DR2. However, the present disclosure is not limited thereto, and a square shape with round corners, other polygonal shapes, a circle shape, or an elliptical shape may be applied as the planar shape of the display device 1.

The display device 1 may include a display area DA and a non-display area NDA that is positioned around the display area DA. The display area DA may generate an image, and the non-display area NDA may not generate an image. A planar shape of the display area DA may be substantially the same as the planar shape of the display device 1. As the planar shape of the display area DA, for example, a rectangular shape may be applied. The non-display area DA may surround edges of the display area DA. The display area DA may include a plurality of pixel areas.

Figure 2:
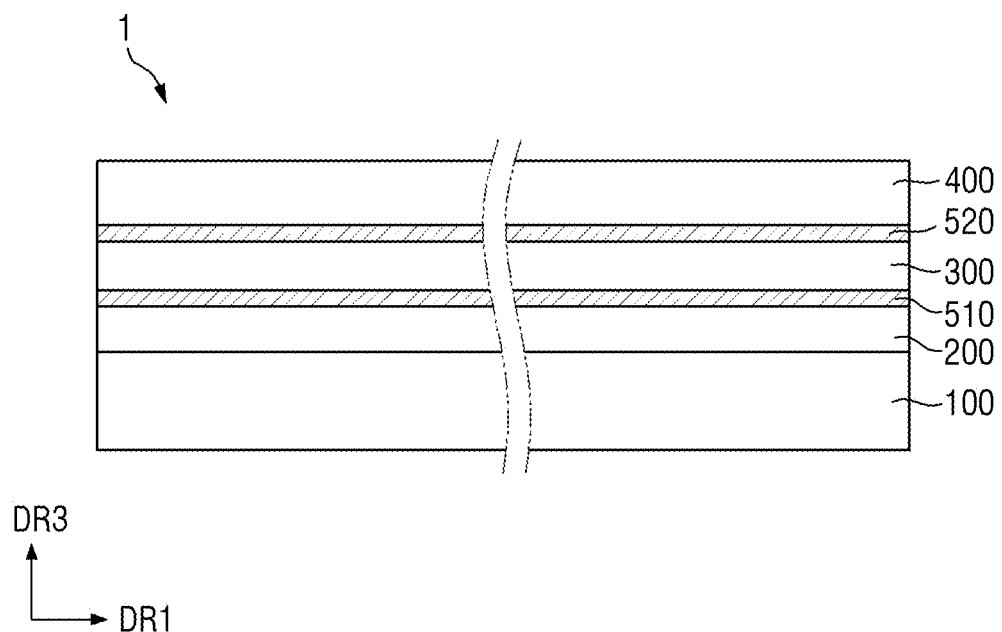
FIG. 2 is a cross-sectional view of the display device according to FIG. 1.

FIG. 2 is a cross-sectional view of the display device according to FIG. 1.

Referring to FIG. 2, the display device 1 may include a display panel 100, an optical path adjustment film 200, an anti-reflection panel 300, and a cover window 400.

The display panel 100 is a panel that displays a screen or an image, and may include an organic light-emitting display panel as an example. However, the present disclosure is not limited thereto, and the display panel 100 may include a panel of a self-luminous display device such as an inorganic light-emitting display panel, a quantum dot light-emitting display panel, a micro-LED display panel, a nano LED display panel, or the like. or a panel of a light-receiving display device such as a liquid crystal display panel, an electrophoretic display panel, or the like.

Hereinafter, the organic light-emitting display panel will be described as an example of the display panel 100, and as long as no special distinction is described, the organic light-emitting display panel applied to one or more embodiments is simply abbreviated as the display panel 100. However, the present disclosure is not limited to the organic light-emitting display panel, and another display panel 100 listed above or any suitable display panel in the art may be applied.

The display panel 100 may include a substrate and a circuit driving layer disposed on the substrate. The circuit driving layer may include a circuit that drives a light-emitting layer of a pixel area. The circuit driving layer may include a plurality of thin film transistors.

A light-emitting element is disposed above the circuit driving layer. The light-emitting element includes a pixel electrode, a light-emitting layer on the pixel electrode, and a common electrode on the light-emitting layer. The light-emitting layer may include an organic light-emitting layer. The light-emitting layer may emit light having various brightness depending on a driving signal transmitted from the circuit driving layer.

The display panel 100 may include a high-refractive lens disposed on the light-emitting layer. The high-refractive lens is disposed in each pixel area to increase light emission efficiency, and serves to prevent or substantially prevent light generated in the corresponding light-emitting layer from traveling to an adjacent pixel area. A description of the high-refractive lens will be provided in more detail below.

The optical path adjustment film 200 may be disposed on the display panel 100. The optical path adjustment film 200 guides light passing through the high-refractive lens so as to travel in a lateral direction, and serves to reduce a change amount of color according to a viewing angle. A description of the optical path adjustment film 200 will be provided in more detail below.

The anti-reflection panel 300 may be disposed on the optical path adjustment film 200. The anti-reflection panel 300 may be coupled to the optical path adjustment film 200 through a first adhesive member 510. The anti-reflection panel 300 may reduce the reflectance of external light incident on the anti-reflection panel 300 from an upper side of the cover window 400. The anti-reflection panel 300 may include a retarder and a polarizer in an embodiment. In addition, the anti-reflection panel 300 may include a black matrix and a color filter. In one or more embodiments, the anti-reflection panel is the black matrix and the color filter, and in this case, the anti-reflection panel 300 may be formed on the display panel 100.

The cover window 400 may protect the display panel 100 from external scratches and the like. The cover window 400 is disposed on the anti-reflection panel 300, but the cover window 400 may be coupled to the anti-reflection panel 300 through a second adhesive member 520.

Here, each of the first and second adhesive members 510 and 520 may be a pressure-sensitive adhesive member (PSA), an optically clear adhesive member (OCA), or an optically clear adhesive film (OCR), as an example.

Figure 3:
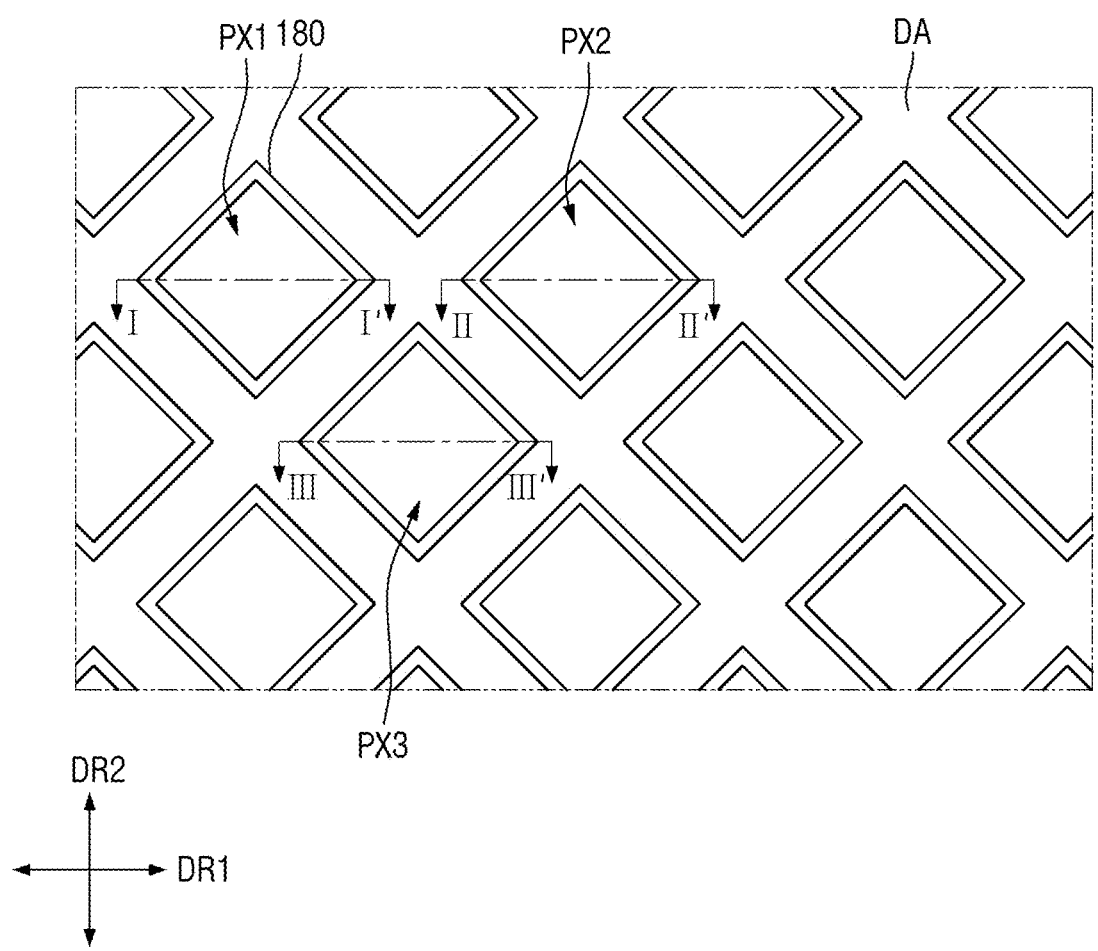
FIG. 3 is a plan view schematically showing a display area of the display device according to FIG. 1.

FIG. 3 is a plan view schematically showing a display area of the display device according to FIG. 1.

Referring to FIG. 3, the display area DA includes a plurality of pixel areas. The display device further includes a bank layer disposed on the pixel electrode, the bank layer may partially cover an upper surface of the pixel electrode, and specifically cover one side portion and the other side portion of the upper surface of the pixel electrode. Therefore, a central portion of the upper surface of the pixel electrode may be exposed (e.g., exposed by the bank layer). The organic light-emitting layer generating light is disposed in the center of the upper surface of the pixel electrode exposed by the bank layer of the display device. An area overlapping in a thickness direction (e.g., a thickness direction of the display panel 100) with the central portion of the upper surface of the pixel electrode exposed by the bank layer of the display device on which the organic light-emitting layer generating light is disposed will be referred to as a pixel area hereinafter. The pixel area may also be interpreted as a light-emitting area in terms of generating light.

The plurality of pixel areas may include a first pixel area PX1 that generates light of a first color, a second pixel area PX2 that generates light of a second color, and a third pixel area PX3 that generates light of a third color. A planar shape of each of the pixel areas PX1 to PX3 (the first pixel area PX1, the second pixel area PX2, and the third pixel area PX3) may have a rhombic shape. However, the present disclosure is not limited thereto, and the planar shape and size of each pixel area PX1 to PX3 may be variously modified in a suitable manner, and all of the pixel areas PX1 to PX3 may have different planar shapes and sizes from each other. Hereinafter, a case in which the planar shape of each of the pixel areas PX1 to PX3 is a rhombic shape will be primarily described.

FIG. 3 illustrates that the pixel areas PX1 to PX3 are arranged in a PenTile (PENTILE® is a registered trademark of Samsung Display Co., Ltd., Republic of Korea) manner. That is, the first pixel area PX1 may be disposed to alternate with the second pixel area PX2 along the first direction DR1. The third pixel area PX3 may be disposed in a row different from that of each of the first and second pixel areas PX1 and PX2 and may be arranged along the first direction DR1. The third pixel area PX3 may be disposed to be adjacent to the first and second pixel areas PX1 and PX2 along a diagonal direction based on the first direction DR1 and the second direction DR2.

In an embodiment, the first pixel area PX1 may display red, the second pixel area PX2 may display blue, and the third pixel area PX3 and a fourth pixel area PX4 may display green.

However, the arrangement relationship of the plurality of pixel areas disposed in the display area DA is not limited to that shown in FIG. 3, and the arrangement relationship between the pixel areas of the plurality of pixel areas may differ depending on a display color of each of the pixel areas, a resolution and an aperture ratio of an applicable display device, or the like.

A high-refractive lens 180 may be disposed in each of the pixel areas PX1 to PX3. The high-refractive lens 180 may be disposed to overlap each of the pixel areas PX1 to PX3, and may cover (e.g., completely cover) each of the pixel areas PX1 to PX3 on a plane (e.g., in a plan view). A planar shape of the high-refractive lens 180 may be the same as a planar shape of each of the overlapped pixel areas PX1 to PX3. For example, when the planar shape of each of the pixel areas PX1 to PX3 has a rhombic shape, the planar shape of the high-refractive lens 180 overlapping each of the pixel areas PX1 to PX3 may also have a rhombic shape. The high-refractive lens 180 serves to emit (e.g., entirely emit) light that is trapped in each of the pixel areas PX1 to PX3 (e.g., light totally reflected between the encapsulation member and the outside) or light generated from the organic light-emitting layer, and thus, in one or more embodiments, the high-refractive lens 180 may cover (e.g., completely cover) the pixel areas PX1 to PX3 on a plane (i.e., at least a width of a lower surface of the high-refractive lens 180 is greater than a width of each of the pixel areas PX1 to PX3), and the planar shape of the high-refractive lens 180 is the same as the planar shape of each of the overlapped pixel areas PX1 to PX3, and thus it is possible to prevent or reduce unnecessary consumption of a high-refractive lens material.

Figure 4:
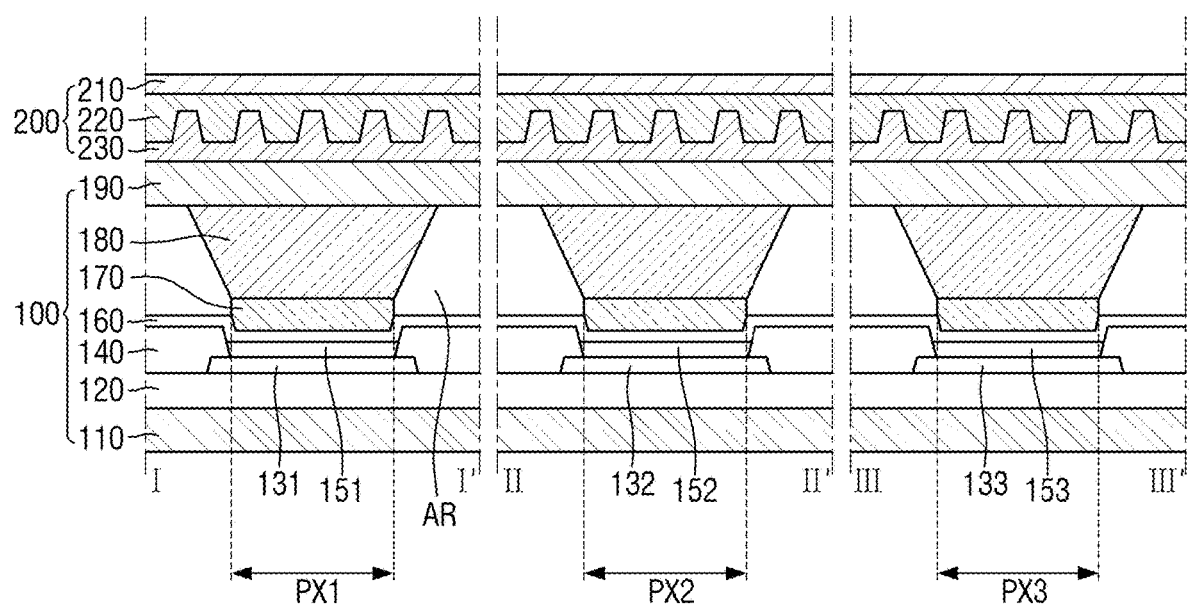
FIG. 4 is a set of cross-sectional views taken along the lines I-I', II-II', and III-III' of FIG. 3.
Figure 5:
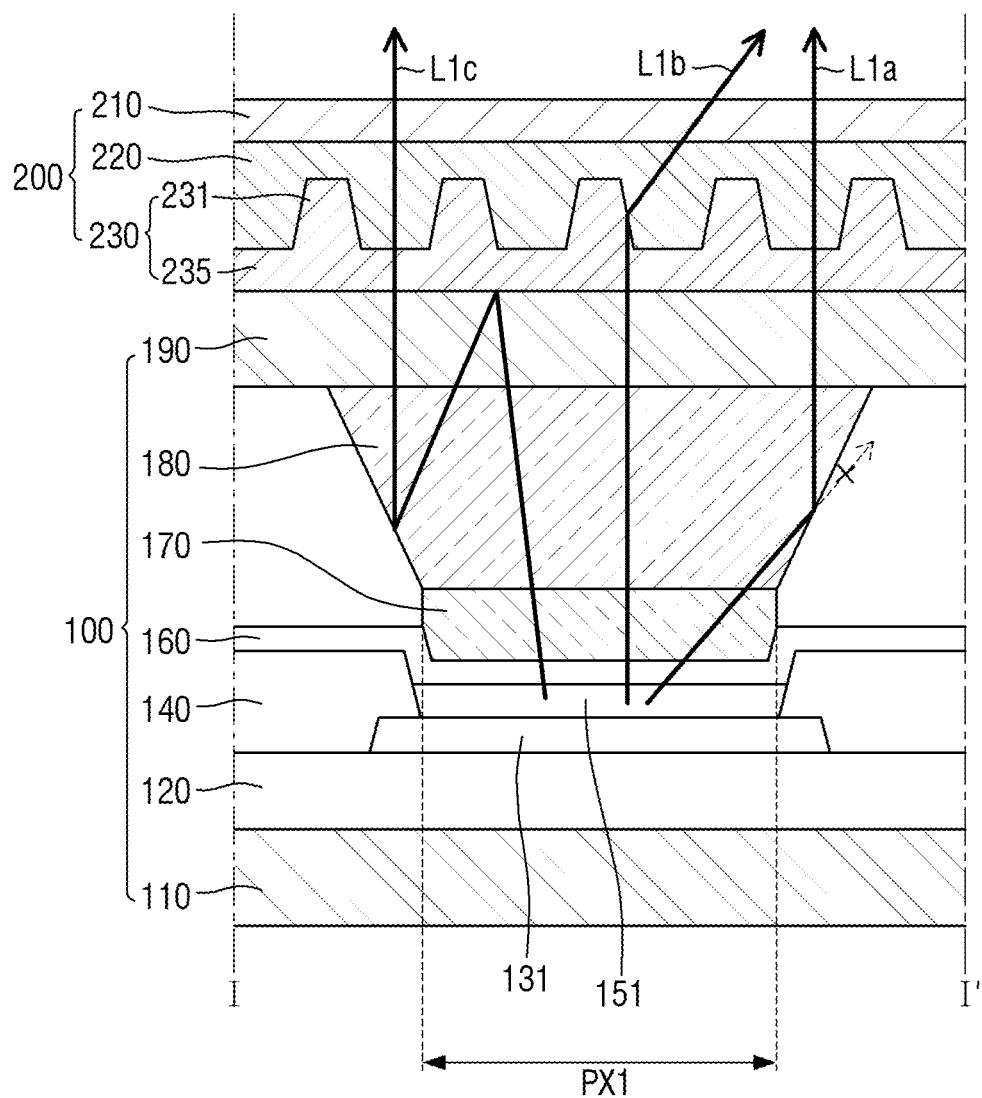
FIG. 5 is a schematic diagram showing that a color change according to brightness and a viewing angle is improved by using a high-refractive lens and an optical path adjustment film according to an embodiment.
Figure 6:
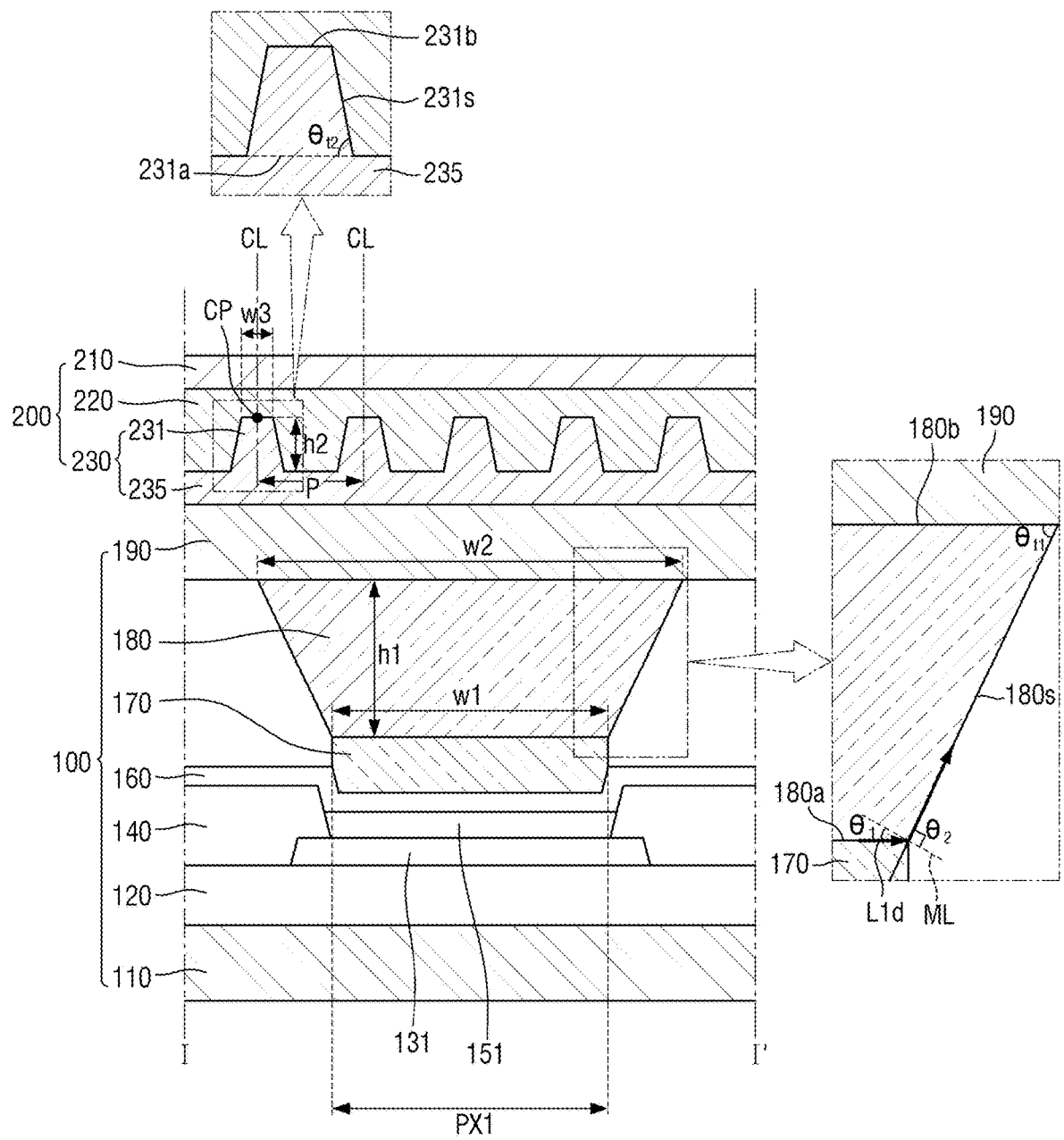
FIG. 6 is a cross-sectional view showing the high-refractive lens and the optical path adjustment film according to an embodiment in more detail.

FIG. 4 is a set of cross-sectional views taken along the lines I-I', II-II', and III-III' of FIG. 3. FIG. 5 is a schematic diagram showing that a color change according to brightness and a viewing angle is improved by using a high-refractive lens and an optical path adjustment film according to an embodiment. FIG. 6 is a cross-sectional view showing the high-refractive lens and the optical path adjustment film according to an embodiment in more detail.

Referring to FIGS. 4-6, the display panel 100 may include a substrate 110, a conductive layer 120, first to third pixel electrodes 131 to 133 (a first pixel electrode 131, a second pixel electrode 132, and a third pixel electrode 133), a bank layer 140, first to third organic light-emitting layers 151 to 153 (a first organic light-emitting layer 151, a second organic light-emitting layer 152, and a third organic light-emitting layer 153), a common electrode 160, a high-refractive lens adhesive member 170, a high-refractive lens 180, and an encapsulation member 190.

The substrate 110 may be an insulating substrate. As an example, the substrate 110 may contain a rigid material such as glass or quartz.

In some embodiments, the substrate 110 may include a polymer material, wherein the polymer material may include polyimide (PI), polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polycarbonate (PC), cellulose triacetate (CAT), cellulose acetate propionate (CAP), or a combination thereof.

The conductive layer 120 may be disposed on the substrate 110. The conductive layer 120 shown in FIG. 4 schematically shows a layer in which a buffer layer, a plurality of conductive wirings, an insulating layer, and a plurality of thin film transistors are disposed.

The plurality of thin film transistors may use amorphous silicon, polysilicon, low temperature polysilicon (LTPS), an oxide semiconductor, an organic semiconductor, etc. as a channel layer. Types (kinds) of channel layers of each of the plurality of thin film transistors may be different from each other. In an embodiment, in consideration of a role or a process sequence of the thin film transistor, a thin film transistor including an oxide semiconductor and a thin film transistor including low temperature polysilicon (LTPS) may both be included in one pixel area.

The first pixel electrode 131 of the first to third pixel electrodes 131 to 133 will be described as a reference. The first pixel electrode 131 may be disposed on the conductive layer 120. The first pixel electrode 131 may be an anode in an embodiment. When the first pixel electrode 131 is the anode, the plurality of pixel electrodes may be formed of a transparent electrode, a translucent electrode, or a reflective material such as aluminum, silver, chromium, or an alloy thereof. The transparent or translucent electrode may contain at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the reflective material may include at least one selected from the group consisting of silver (Ag), magnesium (Mg), chromium (Cr), gold (Au), platinum (Pt), nickel (Ni), copper (Cu), tungsten (W), and aluminum (Al).

The bank layer 140 may be disposed on the pixel electrodes 131 to 133. The bank layer 140 may include a plurality of openings exposing central portions of upper surfaces of the pixel electrodes 131 to 133.

The bank layer 140 may include an organic material or an inorganic material. In an embodiment, the bank layer 140 may include a material such as a photoresist, a polyimide resin, an acrylic resin, a silicone compound, or a polyacrylic resin.

The organic light-emitting layers 151 to 153 may be disposed on the pixel electrodes 131 to 133 and the bank layer 140. The first organic light-emitting layer 151 may be disposed in the first pixel area PX1, the second organic light-emitting layer 152 may be disposed in the second pixel area PX2, and the third organic light-emitting layer 153 may be disposed in the third pixel area PX3. The first organic light-emitting layer 151 may generate and emit red light, the second organic light-emitting layer 152 may generate and emit blue light, and the third organic light-emitting layer 153 may generate and emit green light.

The common electrode 160 may be disposed on the organic light-emitting layers 151 to 153 and the bank layer 140. The common electrode 160 may be a cathode in an embodiment. The common electrode 160 may contain at least one selected from the group consisting of Li, Ca, Lif/Ca, LiF/Al, Al, Ag, and Mg. In addition, the common electrode 160 may be made of a material having a low work function. In an embodiment, the common electrode 160 may be a transparent electrode or a translucent electrode containing at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Each of the pixel electrodes 131 to 133, the organic light-emitting layers 151 to 153 overlapping the corresponding pixel electrodes, and the common electrode 160 may constitute an organic light emitting device OLED. Also, in one or more embodiments, a plurality of organic light emitting devices (OLEDs) may further include a hole transport layer, a hole injection layer, an electron transport layer, and an electron injection layer.

A high-refractive lens 180 from among a plurality of high-refractive lenses 180 may be disposed on corresponding ones of each of the pixel areas PX1 to PX3 and attached to an upper surface of the common electrode 160 through a corresponding high-refractive lens adhesive member 170. A lower surface 180*a* of the high-refractive lens 180 may be in contact with the corresponding high-refractive lens adhesive member 170, and an upper surface 180*b* may be in contact with the encapsulation member 190. Each of the plurality of high-refractive lenses 180 may be disposed to overlap corresponding ones of each of the pixel areas PX1 to PX3 in the thickness direction. A side surface 180*s* of the high-refractive lens 180 may contact an air layer AR.

As described above, the high-refractive lens 180 serves to change a traveling path of light (e.g., see light L1*c*) trapped in each of the pixel areas PX1 to PX3 or light generated from the organic light-emitting layers 151 to 153 (e.g., see light L1*a*) so as to face the front. The corresponding function of the high-refractive lens 180 may be achieved by adjusting a refractive index and a shape of the high-refractive lens 180. Hereinafter, for convenience of description, the high-refractive lens 180 disposed in the first pixel area PX1 will be primarily described.

A width w1 of the lower surface 180*a* of the high-refractive lens 180 may be equal to or greater than a width of the first pixel area PX1 in order to receive the maximum amount of light generated from the first organic light-emitting layer 151 of the first pixel area PX1. A width w2 of the upper surface 180*b* of the high-refractive lens 180 may be larger than the width w1 of the lower surface 180*a* thereof. The width w2 of the upper surface 180*b* of the high-refractive lens 180 is derived from the width w1 of the lower surface 180*a* and a first inclination angle $\theta_{t1}$.

The width w2 of the upper surface 180*b* of the high-refractive lens 180 is formed to be larger than the width w1 of the lower surface 180*a* thereof so that the side surface 180*s* has a downwardly inclined shape (reverse taper shape) from the upper surface 180*b* to the lower surface 180*a* (or inverted trapezoidal shape). Accordingly, as illustrated in FIG. 5, among light generated from the first organic light-emitting layer 151, the light L1*c* reflected from a surface of the encapsulation member 190 (an interface between the encapsulation member 190 and the optical path adjustment film 200) may be totally reflected from the side surface 180*s* to guide the light L1*c* so as to be provided in a front direction, and among the light generated from the first organic light-emitting layer 151, the light L1*a* emitted toward the adjacent pixel areas (the second and third pixel areas PX2 and PX3) may be totally reflected from the side surface 180*s* to guide the light L1*a* so as to be provided in the front direction.

In order to increase the total reflection efficiency of the above-described light L1*a* and light L1*c* from the side surface 180*s*, as illustrated in the enlarged view of FIG. 6, a difference in refractive index between materials in contact with (or touching) the high-refractive lens 180 at the corresponding side surface 180*s* and the first inclination angle $\theta_{t1}$ formed by the upper surface 180*b* and the side surface 180*s* should be adjusted. When the corresponding difference in refractive index and the first inclination angle $\theta_{t1}$ are adjusted so that both of incident light L1*c* in a horizontal direction and light having an incident angle $\theta_1$ (an angle between a normal line ML and an incident direction) larger than the corresponding incident light L1*c* among light incident on the side surface 180*s* of the high-refractive lens 180 are totally reflected, total reflection efficiency is maximized or increased. In an embodiment, because the material touching the side surface 180*s* of the high-refractive lens 180 is an air layer AR, a refractive index of the material in contact with (or touching) the side surface 180*s* of the high-refractive lens 180 may be 1.0.

Figure 7:
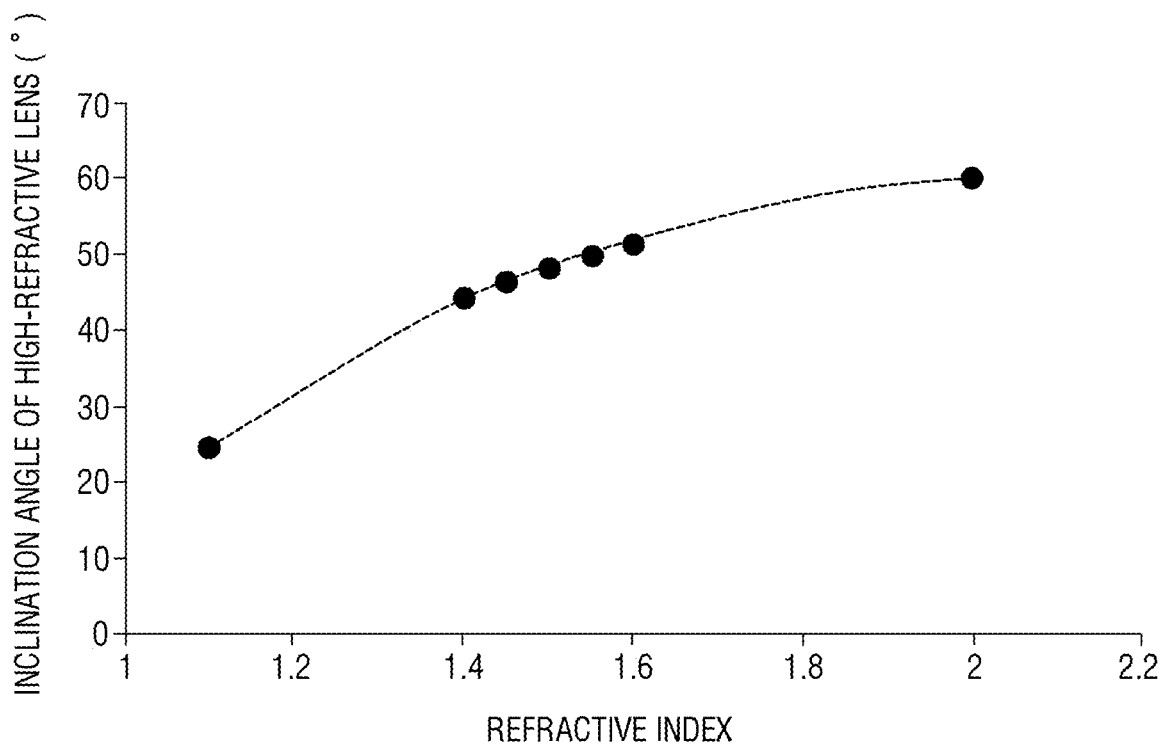
FIG. 7 is a graph showing a correlation between a refractive index and a first inclination angle of a high-refractive lens.

FIG. 7 is a graph showing a correlation between a refractive index of a high-refractive lens and a first inclination angle.

Referring to FIGS. 6 and 7, as the refractive index of the high-refractive lens 180 increases, the first inclination angle $\theta_{t1}$ for totally reflecting (e.g., an exit angle $\theta_2$ is the same as an extending direction of the side surface 180*s*) the incident light L1*c* which is incident in the horizontal direction toward the side surface 180*s* (e.g., the incident angle $\theta_1$ is the same as an angle between the normal line ML and an extending direction of the lower surface 180*a*) tends to increase.

When a total reflection condition of the incident light L1*c* is satisfied by adjusting the first inclination angle $\theta_{t1}$, all light rays having an incidence angle greater than that of the incident light L1*c* are totally reflected, thereby increasing overall total reflection efficiency.

As shown in FIG. 7, when the first inclination angle $\theta_{t1}$ is adjusted according to the refractive index of the high-refractive lens 180, the total reflection efficiency may be increased regardless of the refractive index, but, in one or more embodiments, there may be a preferred refractive index range based on a material cost of the high-refractive lens 180 and/or the degree of freedom in selecting a material.

For example, the refractive index of the high-refractive lens 180 according to an embodiment may be 1.4 to 2.0.

When the refractive index of the high-refractive lens 180 is 1.4 or more, a difference in refractive index from the air layer AR contacting the side surface 180*s* may be increased, and the first inclination angle $\theta_{t1}$ for totally reflecting all light rays having an incidence angle greater than the incident angle $\theta_1$ of the incident light L1*c* (e.g., the angle between the normal line ML and the incident direction) becomes small, so that the width w2 of the upper surface 180*b* should be greatly increased, which may prevent or reduce the consumption of a high-refractive lens material and resulting additional costs. In addition, when the refractive index of the high-refractive lens 180 is 2.0 or less, the degree of freedom for selecting a material that may be considered as a material of the high-refractive lens 180 is increased. Any suitable material that satisfies the corresponding refractive index range may be used. For example, the high-refractive lens 180 may include an organic insulating resin or an inorganic insulating resin. However, the present disclose is not limited thereto.

A range of the first inclination angle $\theta_{t1}$ that satisfies the total reflection condition in the refractive index range of the high-refractive lens 180 may be 44° to 60°.

A thickness h1 from the upper surface 180*b* to the lower surface 180*a* of the high-refractive lens 180 may be determined depending on the first width w1 and the first inclination angle $\theta_{t1}$, but, in one or more embodiments, it may be preferable for the thickness h1 to be in a range of 1 μm to 30 μm. When the thickness h1 of the high-refractive lens 180 is 1 μm or more, an area of the side surface 180*s* of the high-refractive lens 180 may be sufficiently secured, so that the total reflection efficiency may be increased, and when the thickness h1 of the high-refractive lens 180 is 30 μm or less, the display device may be made thin by thinning the thickness of the high-refractive lens 180. Hereinafter, FIGS. 9-11 are further referred to for describing an effect of the high-refractive lens 180.

Figure 9:
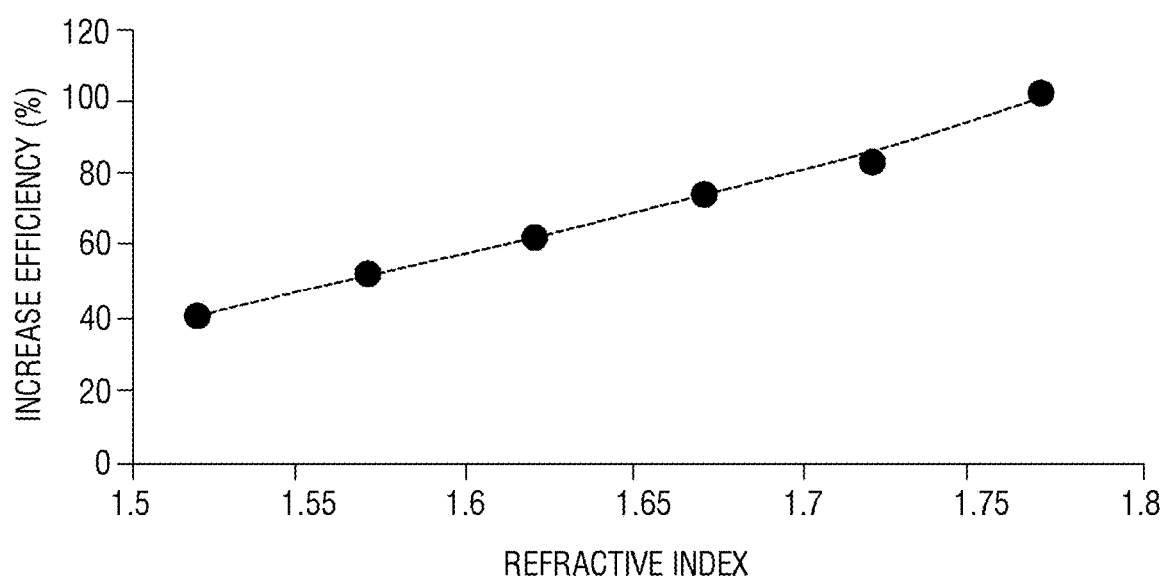
FIG. 9 is a graph showing a correlation between a refractive index and light emission efficiency of a high-refractive lens.
Figure 10:
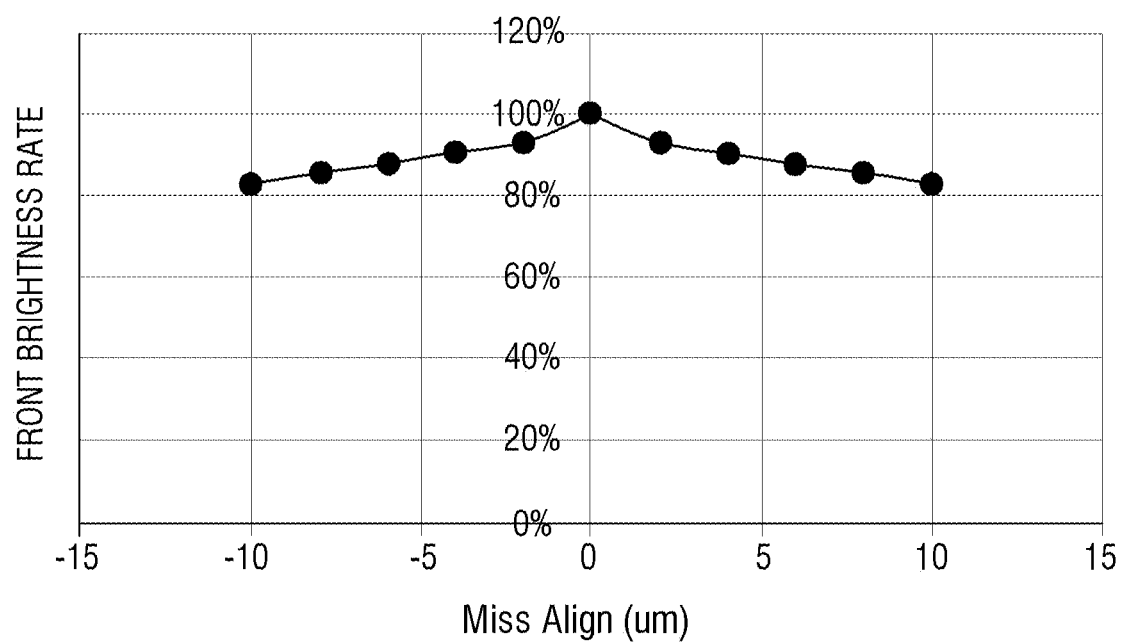
FIG. 10 is a graph showing a correlation between an alignment tolerance (miss align (e.g., misalignment)) and a front brightness ratio (e.g., a front brightness rate) of a pixel area and a high-refractive lens.

FIG. 9 is a graph showing a correlation between a refractive index and light emission efficiency of a high-refractive lens. FIG. 10 is a graph showing a correlation between an alignment tolerance (miss align) and a front brightness ratio of a pixel area and the high-refractive lens.

Figure 11:
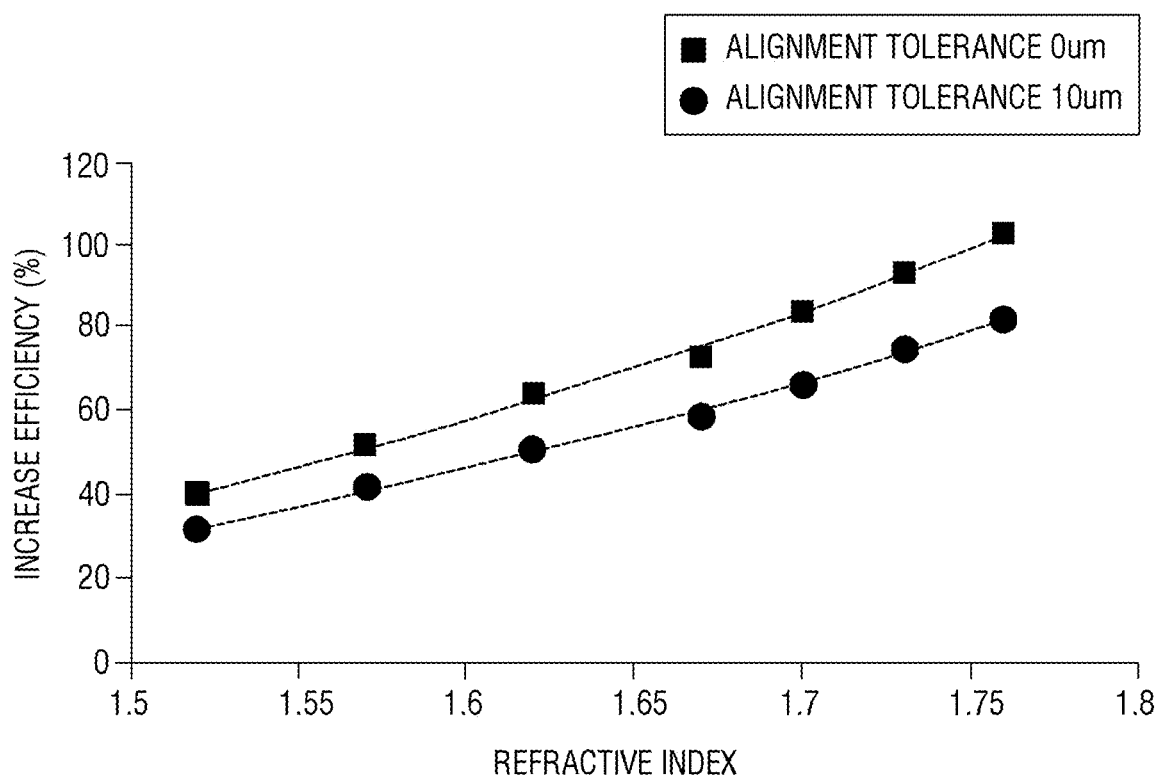
FIG. 11 is a graph showing a correlation between the refractive index of the high-refractive lens and increased light emission efficiency according to an alignment tolerance.

FIG. 11 is a graph showing a correlation between the refractive index of the high-refractive lens and increased light emission efficiency according to the alignment tolerance. A horizontal axis of FIG. 9 represents the refractive index of the high-refractive lens 180, and a vertical axis represents the increased light emission efficiency (%).

First, as shown in FIG. 9, six high-refractive lens samples having different refractive indexes (or refractive indices) are prepared. The thickness, shape, and first inclination angle of each of the high-refractive lens samples described above in FIG. 6 are all the same, and as a result of measuring the increased light emission efficiency (%) of a display device to which each sample is applied, it was confirmed that the sample having a higher refractive index has a larger increase in light emission efficiency than the display device to which the high-refractive lens is not applied. Through the graph of FIG. 9, it can be confirmed that the refractive index of the high-refractive lens affects an increase in light emission efficiency of the display device.

As shown in FIG. 10, eleven display device samples having different alignment degrees of the pixel area of the high-refractive lens are prepared. In a case in which the high-refractive lens and the pixel area are correctly aligned through FIG. 10, when brightness in front of the display device is 100%, a change in brightness at the front of the display device may be confirmed according to a degree of misalignment between the high-refractive lens and the pixel area (e.g., offset or alignment tolerance between the center of the high-refractive lens and the center of the pixel area). As shown in FIG. 10, as the degree of misalignment between the high-refractive lens and the pixel area increases, the brightness at the front of the display device mostly decreases in inverse proportion. When the misalignment between the high-refractive lens and the pixel area is 10 μm, it is confirmed that the brightness at the front of the display device is lowered to 80% compared to the case in which the high-refractive lens and the pixel area are correctly aligned.

However, as shown in FIG. 11, even when the misalignment between the high-refractive lens and the pixel area is 10 μm, it was confirmed that when the high-refractive lens is applied to the display device, the light emission efficiency is increased compared to the display device to which the high-refractive lens is not applied at all.

Referring again to FIGS. 4-6, the encapsulation member 190 is in contact with a plurality of high-refractive lenses 180 and covers the organic light-emitting layers 151, 152, and 153 to protect the organic light-emitting layers from outside air or moisture. The encapsulation member 190 according to an embodiment may include a rigid material such as glass or quartz.

The optical path adjustment film 200 is disposed on the encapsulation member 190. The optical path adjustment film 200 is disposed across the plurality of pixel areas PX1, PX2, and PX3. The optical path adjustment film 200 may transmit light L1a provided by being totally reflected through the high-refractive lens 180 below the optical path adjustment film 200, or light L1b directly provided from the organic light-emitting layer 151 as it is (e.g., see light L1c), or may transmit light by changing a path to a lateral direction (e.g., see light L1b). When an amount of light emitted in the front direction by being totally reflected through the high-refractive lens 180 increases, an amount of light that travels to the side surface decreases naturally, which causes a color change, character blur, or the like according to a viewing angle.

However, the display device 1 according to an embodiment increases light emission efficiency by changing a traveling path of light trapped in the pixel areas PX1 to PX3 so as to face the front through the high-refractive lens 180, and the color change, character blur, or the like according to the viewing angle, which may be generated by the high-refractive lens 180 is compensated for through the optical path adjustment film 200, thereby increasing light emission efficiency and effectively solving the issue of the color change or the character blur according to the viewing angle.

The optical path adjustment film 200 may include a pattern portion 230 including a protruding pattern 231 and a support portion 235 disposed on the encapsulation member 190, a cover layer 220 disposed on the pattern portion 230, and an optical path adjustment substrate 210 disposed on the cover layer 220. A lower surface 231a of the protruding pattern 231 may be in contact with the support portion 235, and an upper surface 231b and a side surface 231s may be in contact with the cover layer 220. The protruding pattern 231 protrudes in the thickness direction from an upper surface of the support portion 235. In one or more embodiments, a plurality of protruding patterns 231 may be provided, and the plurality of protruding patterns 231 may be disposed to be spaced from each other in a direction. In an area in which the protruding pattern 231 is not disposed (e.g., a space between adjacent protruding patterns 231), the upper surface of the support portion 235 may be in direct contact with the cover layer 220. In other words, the cover layer 220 may be in the space between adjacent protruding patterns 231.

Among the light L1a, L1b, and L1c provided from the encapsulation member 190 to the optical path adjustment film 200, light incident on the side surface 231s of the protruding pattern 231 (e.g., see light L1b) is refracted so as to be inclined in a lateral direction from an interface between the cover layer 220 and the side surface 231s of the protruding pattern 231. In order to refract the light L1b incident on the side surface 231s so as to be inclined in the lateral direction from the interface between the cover layer 220 and the side surface 231s of the protruding pattern 231, a refractive index of the cover layer 220 should be larger than a refractive index of the protruding pattern 231, and the side surface 231s should be inclined downward from the upper surface 231b to the lower surface 231a (regular tapered shape), and thus a condition in which a second inclination angle $\theta_{t2}$ between the lower surface 231a and the side surface 231s of the protruding pattern 231 is an acute angle should be satisfied. In order to satisfy the condition that the second inclination angle $\theta_{t2}$ between the lower surface 231a and the side surface 231s of the protruding pattern 231 is an acute angle, a width of the lower surface 231a of the protruding pattern 231 may be greater than a width of the upper surface 231b thereof.

The second inclination angle $\theta_{t2}$ between the lower surface 231a and the side surface 231s of the protruding pattern 231 may be 80° to 89°. When the second inclination angle $\theta_{t2}$ between the lower surface 231a and the side surface 231s of the protruding pattern 231 is 80° to 89°, a traveling path of light provided to the side surface 231s of the protruding pattern 231 may be effectively changed to the lateral direction.

A difference in refractive index between the protruding pattern 231 and the cover layer 220 according to an embodiment may be 0.12 to 0.2. When the difference in refractive index between the protruding pattern 231 and the cover layer 220 is 0.12 or more, a difference in refractive index at the interface between the cover layer 220 and the side surface 231s of the protruding pattern 231 may be increased, and thus the traveling path of the light provided to the side surface 231s of the protruding pattern 231 may be effectively changed to the lateral direction, and when the difference in refractive index between the protruding pattern 231 and the cover layer 220 is 0.2 or less, it is possible to increase the degree of freedom for selecting each material of the protruding pattern 231 and the cover layer 220. Therefore, any suitable material that satisfies a range of the above-described difference in refractive index between the protruding pattern 231 and the cover layer 220 may be used. For example, the protruding pattern 231 may contain a monomer-based material, and the cover layer 220 may contain a monomer-based material or acrylic-based material. The refractive index of the protruding pattern 231 may be adjusted through the addition of fluorine (F), and the refractive index of the cover layer 220 may be adjusted through inorganic particles (e.g., $ZrO_2$ or $TiO_2$), but the present disclosure is not limited thereto.

The support portion 235 includes the same material as the protruding pattern 231 and may be formed concurrently (e.g., simultaneously) through the same process. The optical path adjustment film 200 according to an embodiment may be formed by a method of applying (e.g., entirely applying) a material layer of a cover layer on the optical path adjustment substrate 210 containing polyethylene terephthalate (PET), or the like, pressing the material layer of the cover layer by using a stamper to form a concave pattern corresponding to the protruding pattern 231 in the material layer of the cover layer through a protrusion portion of the stamper, and applying (e.g., entirely applying) a pattern portion material layer on the corresponding concave pattern and on an area adjacent to the concave pattern.

Figure 8:
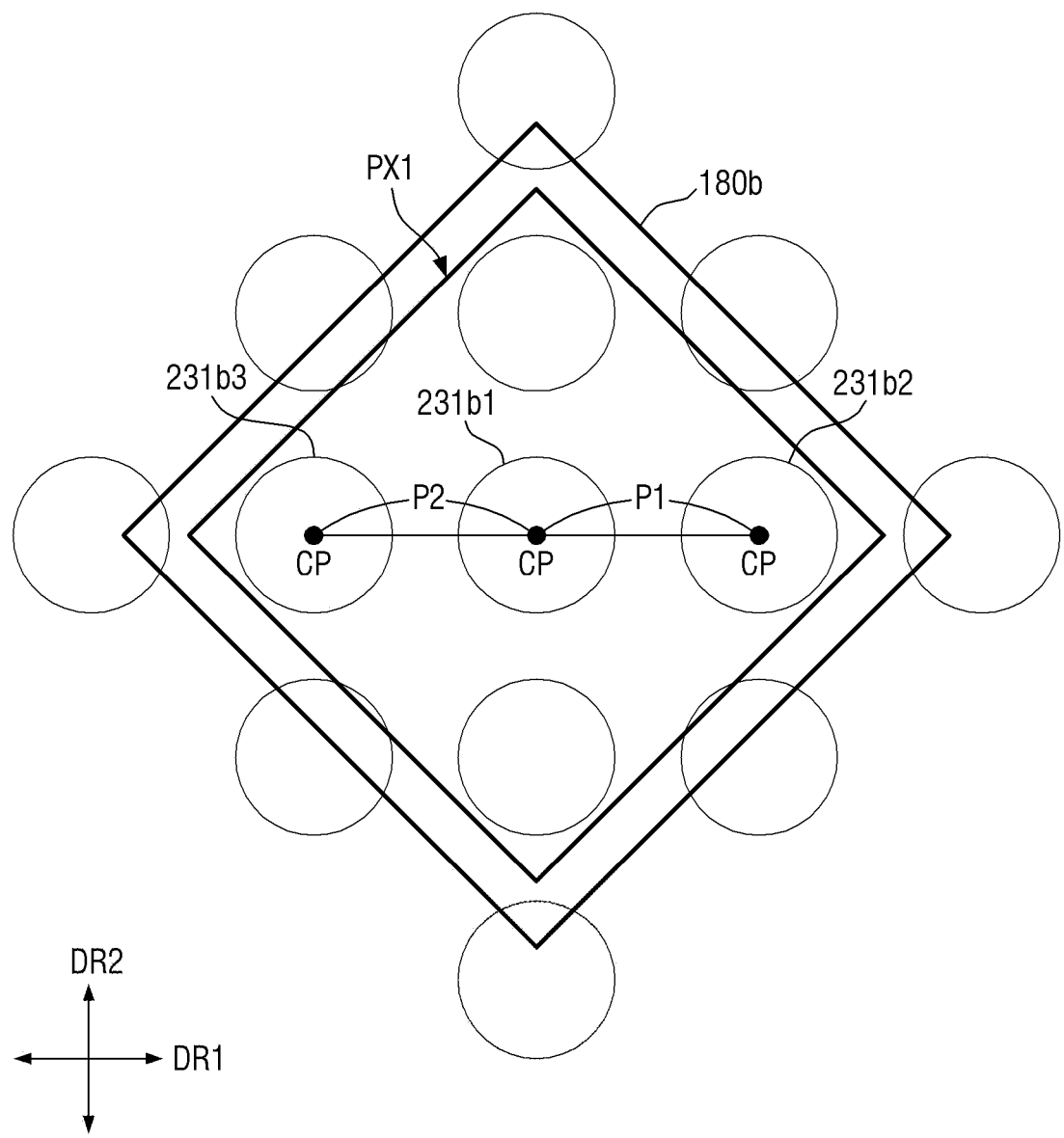
FIG. 8 is a plan view schematically showing a first pixel area, a high-refractive lens, and an optical path adjustment film according to an embodiment.

FIG. 8 is a plan view schematically showing a first pixel area, a high-refractive lens, and an optical path adjustment film according to an embodiment. In the plan view of FIG. 8, the upper surface 231b of the protruding pattern 231 of the optical path adjustment film 200 and the upper surface 180b of the high-refractive lens 180 are illustrated.

Further referring to FIG. 8 along with FIGS. 4-6, a high-refractive lens 180 may overlap the plurality of protruding patterns 231 in the thickness direction (e.g., in a plan view). For example, one high-refractive lens 180 may overlap up to five protruding patterns 231 arranged with each other along the first direction DR1 (e.g., see FIG. 6). In other words, as shown in FIG. 6, up to five protruding patterns 231 from among a row of protruding patterns 231 arranged along the first direction DR1 may overlap a high-refractive lens 180 in the thickness direction. Each of the protruding patterns 231 may have an upper surface width w3 (e.g., a predetermined upper surface width), a pitch P, and a thickness h2 (e.g., a thickness h2 in the thickness direction of the substrate 110). The pitch P of the protruding pattern 231 refers to a separation distance between equal division lines CL equally dividing adjacent protruding patterns 231.

In more detail, the pitch P of the protruding pattern 231 may be 10 μm to 30 μm. When the pitch P of the protruding pattern 231 is 30 μm or less, the traveling path of the light provided to the side surface 231s of the protruding pattern 231 may be effectively changed to the lateral direction, and when the pitch P of the protruding pattern 231 is 10 μm or more, it is possible to prevent or substantially prevent adjacent protruding patterns 231 from being in contact with each other.

The width w3 of the upper surface 231b of the protruding pattern 231 may be 5 μm to 7 μm. When the width w3 of the upper surface 231b of the protruding pattern 231 is 5 μm or more, it is easy to form a protruding portion forming the concave pattern of the stamper and it is possible to physically maintain the protruding pattern 231, and when the width w3 of the upper surface 231b of the protruding pattern 231 is 7 μm or less, it may be easy to form an indentation corresponding to a convex pattern between the concave patterns of the stamper.

In addition, the thickness h2 from the upper surface 231b to the lower surface 231a of the protruding pattern 231 may be determined according to the upper surface width w3 of the protruding pattern 231. A ratio of the upper surface width w3 and the thickness h2 may be 1:1 to 1:1.5. When the ratio of the upper surface width w3 and the thickness h2 is 1:1 or more, it is possible to secure sufficiently the thickness h2 relative to the upper surface width w3, thereby securing a sufficient area of the side surface 231s, and when the ratio of the upper surface width w3 and the thickness h2 is 1:1.5 or less, the physical reliability of the protruding pattern 231 may be secured.

Also, a randomness (%) of the pitch P of the protruding pattern 231 may be 20% to 50%. Referring to FIGS. 6 and 8, a point at which the upper surface 231b of each protruding pattern 231 and the division line CL meet may refer to an equal division point CP (or a center point), and illustratively, an upper surface 231b1 of a first high-refractive lens positioned near the center of the upper surface 180b of the high-refractive lens 180 on a plane (e.g., in a plan view), an upper surface 231b2 of a second high-refractive lens positioned adjacent to one side of the first high-refractive lens in the first direction DR1, and an upper surface 231b3 of a third high-refractive lens positioned adjacent to the other side of the first high-refractive lens in the first direction DR1 are shown. A center point CP of the first high-refractive lens and a center point CP of the second high-refractive lens may have a first pitch P1, and the center point CP of the first high-refractive lens and a center point CP of the third high-refractive lens may have a second pitch P2. Each of the first and second pitches P1 and P2 may have a pitch value within a randomness (%) of a reference pitch. The reference pitch is in a range of 10 μm to 30 μm, and the first and second pitches P1 and P2 each having a pitch value within the randomness (%) of the reference pitch also satisfy the range of 10 μm to 30 μm. For example, when the randomness (%) of the pitch P of the protruding pattern 231 is 20%, each of the first and second pitches P1 and P2 has a pitch within a range of 0.8 times to 1.2 times the reference pitch. When the randomness (%) of the pitch P of the protruding pattern 231 is 50%, each of the first and second pitches P1 and P2 has a pitch within a range of 0.5 times to 1.5 times the reference pitch.

When the randomness (%) of the pitch P of the protruding pattern 231 is 20% or more, it is possible to prevent or substantially prevent a moire from being generated by the pixel areas PX1 to PX3 and the protruding patterns 231 having a constant pitch of the display device, and when the randomness (%) of the pitch P of the protruding pattern 231 is 50% or less, in a process of disposing the protruding patterns 231, it is possible to prevent or substantially prevent adjacent protruding patterns 231 from being in contact with each other.

Hereinafter, an effect of the display device according to an embodiment to which the high-refractive lens 180 and the optical path adjustment film 200 described above are applied will be described with reference to FIGS. 12-15.

Figure 12:
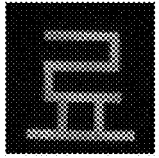
FIG. 12 is a view showing an improvement in character blur of the display device according to an embodiment.
Figure 12:
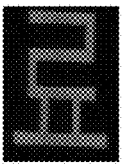
Figure 12:
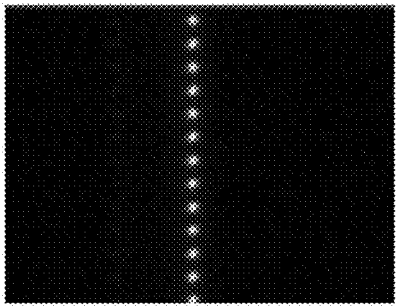
Figure 12:
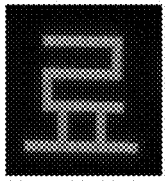
Figure 12:
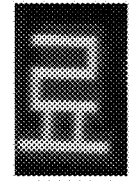
Figure 12:
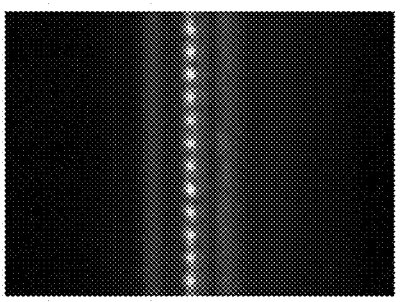

FIG. 12 is a view showing an improvement in character blur of the display device according to an embodiment.

Referring to FIG. 12, a display device sample to which the above-described high-refractive lens 180 and optical path adjustment film 200 are applied and a display device sample to which only the above-described optical path adjustment film 200 is applied are prepared. Each display device sample displays the same characters. The display device sample to which only the optical path adjustment film 200 is applied and the display device sample to which the high-refractive lens 180 and the optical path adjustment film 200 are applied have almost no character blur when looking at the corresponding displayed character from the front, but when viewing the corresponding displayed character from a side surface (e.g., left 45°), it was confirmed that there was almost no character blur in case of the display device sample to which the high-refractive lens 180 and the optical path adjustment film 200 are applied compared to the display device sample to which only the optical path adjustment film 200 is applied.

In addition, as shown in FIG. 12, in the display device sample to which the above-described high-refractive lens 180 and optical path adjustment film 200 are applied compared to the display device sample to which only the optical path adjustment film 200 is applied, it was confirmed that there were almost no double images occurring when viewed from the side surface.

Figure 13:
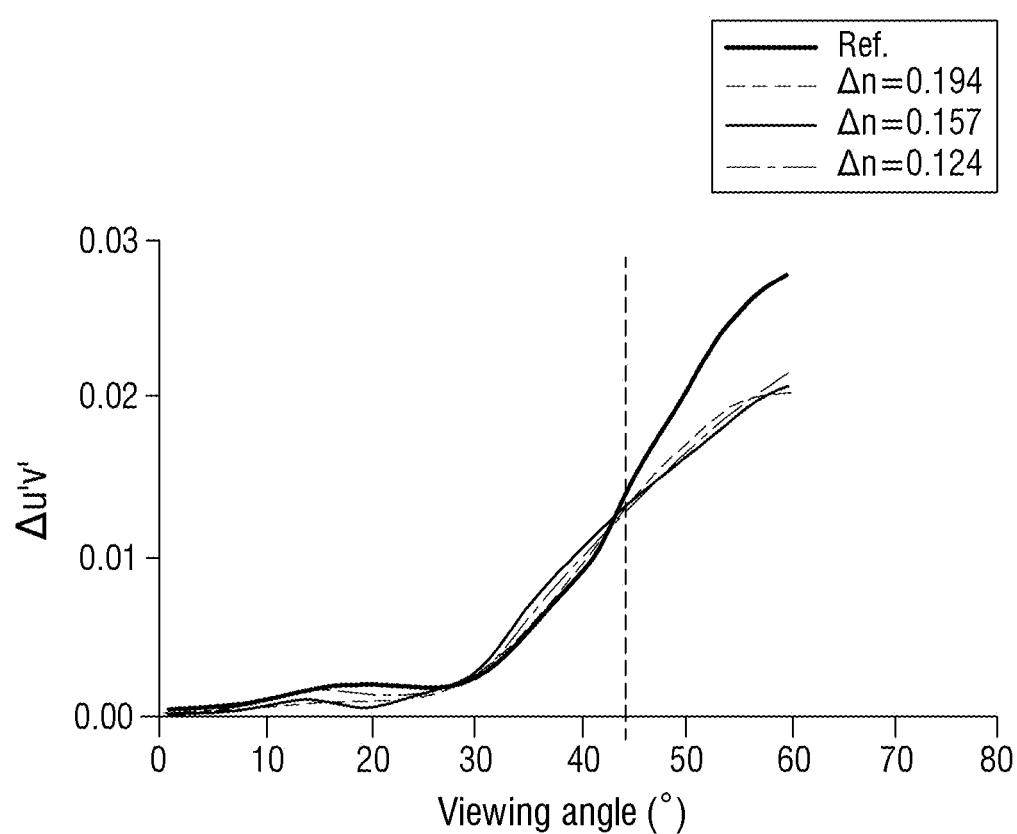
FIG. 13 is a graph showing a correlation between a viewing angle and a color coordinate change amount Δu'v' for each difference in refractive index between a protruding pattern and a cover layer when an inclination angle of the protruding pattern is 88°.
Figure 14:
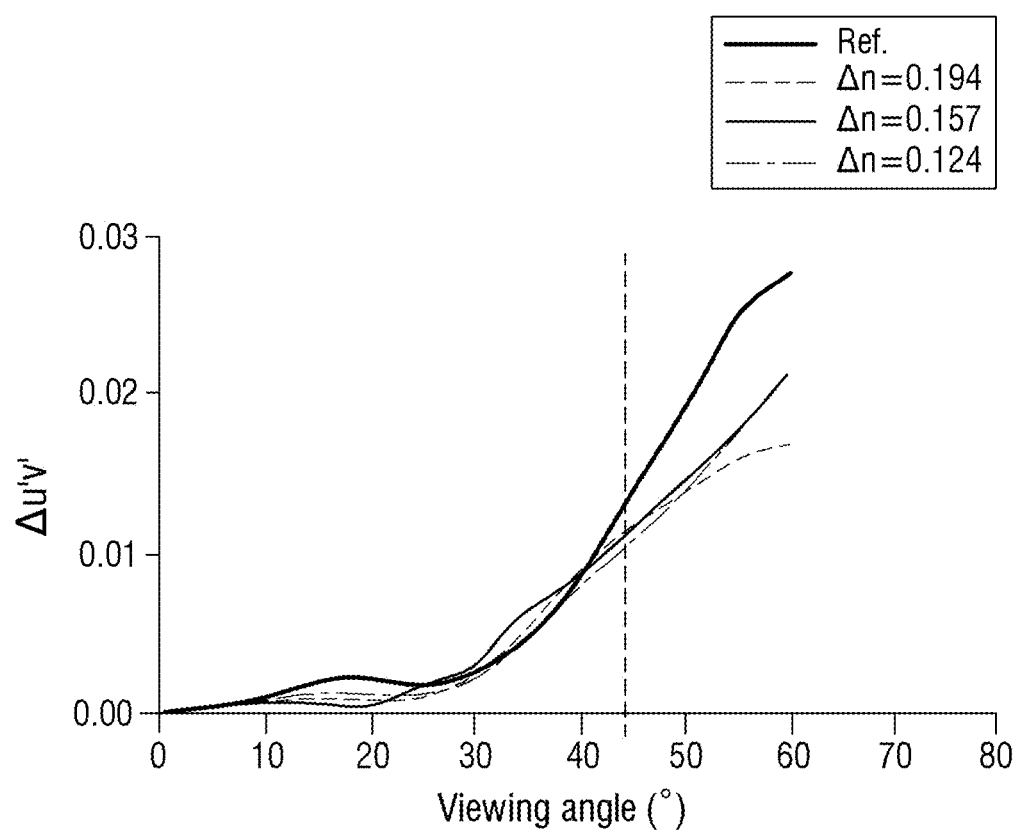
FIG. 14 is a graph showing a correlation between a viewing angle and a color coordinate change amount Δu'v' for each difference in refractive index between the protruding pattern and the cover layer when the inclination angle of the protruding pattern is 85°.

FIG. 13 is a graph showing a correlation between a viewing angle and a color coordinate change amount Δu'v' for each difference in refractive index between the protruding pattern and the cover layer when the inclination angle (e.g., the second inclination angle $\theta_{t2}$ in FIG. 6) of the protruding pattern is 88°. FIG. 14 is a graph showing a correlation between a viewing angle and a color coordinate change amount Δu'v' for each difference in refractive index between the protruding pattern and the cover layer when the inclination angle (e.g., the second inclination angle $\theta_{t2}$ in FIG. 6) of the protruding pattern is 85°.

Referring to FIG. 13 along with FIG. 4, after preparing a display device sample (Ref) to which the optical path adjustment film 200 is not applied, a display device sample (Δn=0.194) having a difference in refractive index between the protruding pattern 231 and the cover layer 220 of 0.194, a display device sample (Δn=0.157) having a difference in refractive index between the protruding pattern 231 and the cover layer 220 of 0.157, and a display device sample (Δn=0.124) having a difference in refractive index between the protruding pattern 231 and the cover layer 220 of 0.124, a color coordinate change amount (Δu'v') was measured for each sample while changing the viewing angle. A rigid material was applied as the encapsulation member for the corresponding samples of FIG. 13. The inclination angle of the protruding pattern 231 of each sample to which the optical path adjustment film 200 is applied is 88°. As confirmed in FIG. 13, each sample shows no significant difference in color coordinate change amount Δu'v' until the viewing angle is around 45°, but in the display device sample (Ref) to which the optical path adjustment film 200 is not applied compared to the samples to which the optical path adjustment film 200 is applied, the color coordinate change amount Δu'v' increases (e.g., increases significantly) when the viewing angle is 45° or more.

Referring to FIG. 14 along with FIG. 4, unlike FIG. 13, the inclination angle of the protruding pattern 231 of each sample to which the optical path adjustment film 200 is applied is 85°. Because the rest of the description is the same, a redundant description thereof may not be repeated.

Figure 15:
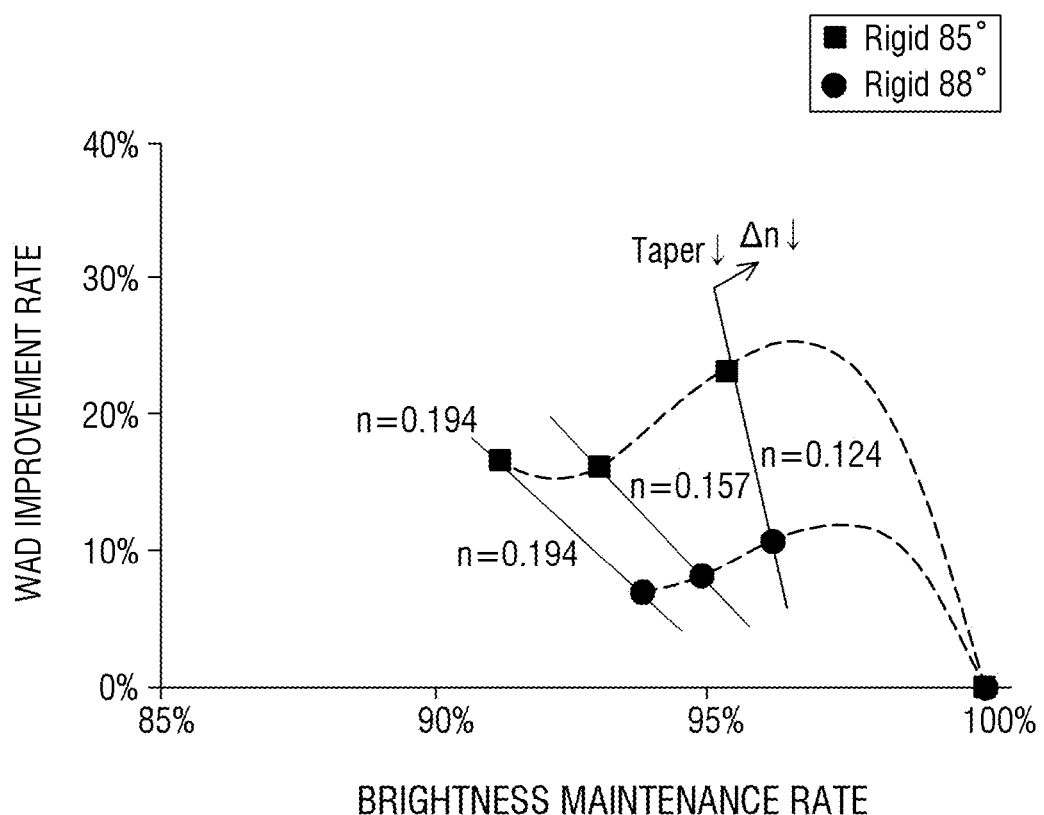
FIG. 15 is a graph showing a brightness maintenance rate according to the difference in refractive index between the protrusion pattern and the cover layer and an improvement rate in color change according to the viewing angle for each of the inclination angles 85° and 88° of the protrusion pattern.

FIG. 15 is a graph showing a brightness maintenance rate according to the difference in refractive index between the protrusion pattern and the cover layer and an improvement rate in color change according to the viewing angle for each of the inclination angles 85° and 88° of the protrusion pattern. In the graph of FIG. 15, a horizontal axis represents the front brightness maintenance rate, and a vertical axis represents the color change improvement rate according to the viewing angle. The viewing angle is 45°. A rigid material was applied as the encapsulation member of the corresponding samples.

Referring to FIG. 15, the front brightness maintenance rate (%) and the improvement rate in color change (%) were measured for the display device sample (Δn=0.194) having a difference in refractive index between the protruding pattern 231 and the cover layer 220 of 0.194, the display device sample (Δn=0.157) having a difference in refractive index between the protruding pattern 231 and the cover layer 220 of 0.157, and the display device sample (Δn=0.124) having a difference in refractive index between the protruding pattern 231 and the cover layer 220 of 0.124 in which the second inclination angle $\theta_{t2}$ of the protruding pattern 231 described in FIGS. 13 and 14 is 85°, and the display device sample (Δn=0.194) having a difference in refractive index between the protruding pattern 231 and the cover layer 220 of 0.194, the display device sample (Δn=0.157) having a difference in refractive index between the protruding pattern 231 and the cover layer 220 of 0.157, and the display device sample (Δn=0.124) having a difference in refractive index between the protruding pattern 231 and the cover layer 220 of 0.124 in which the second inclination angle $\theta_{t2}$ of the protruding pattern 231 is 88°.

As confirmed in FIG. 15, according to each display device sample, the improvement rate in color change (%) is improved, but the front brightness maintenance rate (%) decreases (e.g., gradually decreases) as the difference in refractive index between the protruding pattern 231 and the cover layer 220 increases. As the difference in refractive index between the protruding pattern 231 and the cover layer 220 increases, the total reflection ratio at an outer surface of the cover layer 220 increases, and thus it is considered that the color change according to the viewing angle is improved and the front brightness maintenance rate is reduced.

However, in the display device according to an embodiment, the improvement rate in color change (%) is improved through the optical path adjustment film 200, and the reduction in front brightness maintenance rate caused by the refractive index of the cover layer 220 is compensated for by the high-refractive lens 180 described above, and as a result, there is an advantage of reducing the color change according to the viewing angle and increasing the front light emission efficiency.

Hereinafter, another embodiment of the display device according to an embodiment will be described. In the following embodiment, the same or like components as those of the embodiments already described may be referred to with the same reference numerals, and the description thereof may be simplified or not repeated.

Figure 16:
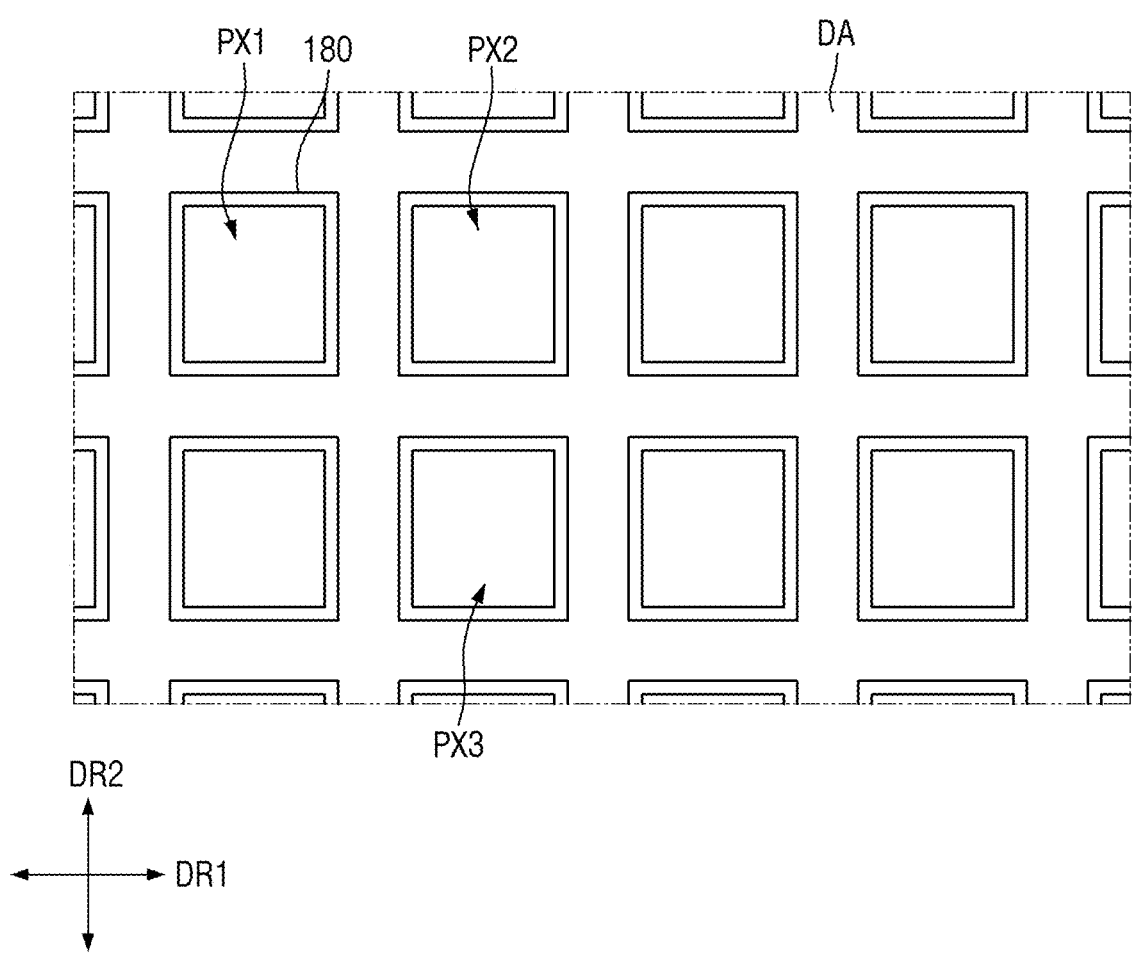
FIG. 16 is a plan view showing a modified example of the display area according to FIG. 2.

FIG. 16 is a plan view showing a modified example of the display area according to FIG. 2.

Referring to FIG. 16, it is illustrated that the planar shape of the pixel areas PX1 to PX3 and the planar shape of the high-refractive lens 180 may be variously modified in a suitable manner. As shown in FIG. 16, the pixel areas PX1 to PX3 and the high-refractive lens 180 may have a rectangular shape or a square planar shape. Even in the case of the present embodiment, the planar shape of the high-refractive lens 180 is formed to be the same as the planar shape of each of the overlapping pixel areas PX1 to PX3, and the high-refractive lens 180 may cover (e.g., cover completely) each of the pixel areas PX1 to PX3, and accordingly, it is possible to prevent or reduce unnecessary consumption of a high-refractive lens material FIG. 17 is a cross-sectional view of a display device according to another embodiment.

Figure 17:
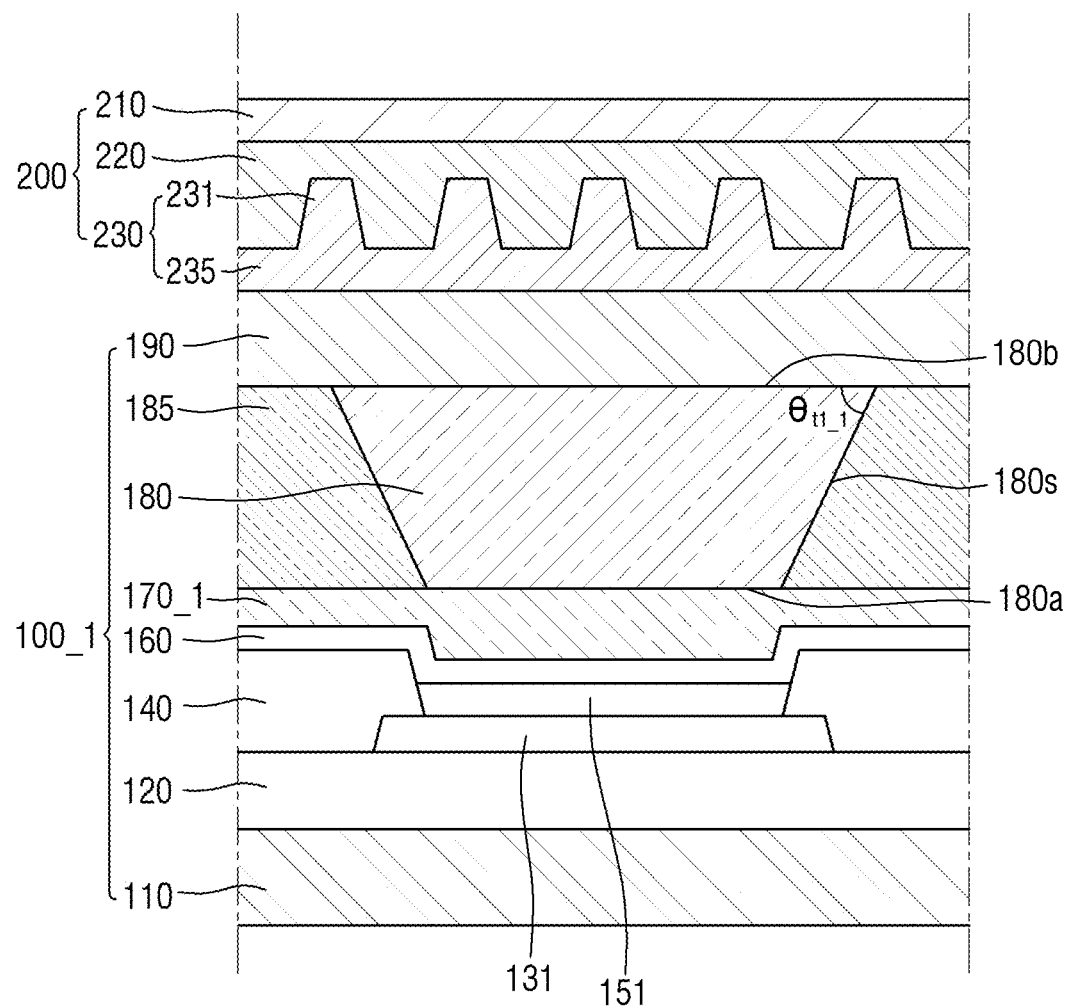
FIG. 17 is a cross-sectional view of a display device according to another embodiment.

Referring to FIG. 17, in a display panel 100_1 according to the present embodiment, a material in contact with the side surface 180s of the high-refractive lens 180 further includes a low-refractive material layer 185, and there is a difference from the embodiment according to FIG. 6 in that a high-refractive lens adhesive member 170_1 couples each of the low-refractive material layer 185 and the high-refractive lens 180 to the common electrode 160. The low-refractive material layer 185 may have a refractive index smaller than that of the high-refractive lens 180.

The present embodiment illustrates that a material having a refractive index smaller than that of the high-refractive lens 180 may be applied instead of an air layer as the material in contact with the side surface 180s of the high-refractive lens 180.

Figure 18:
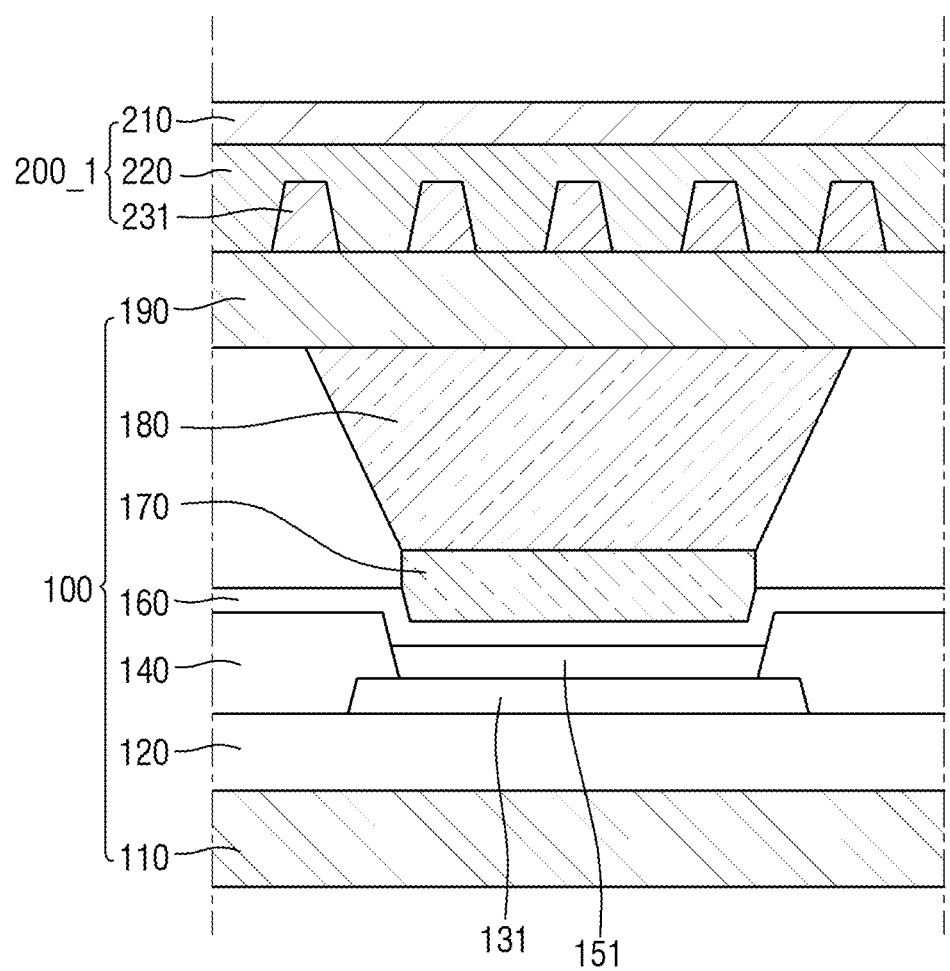
FIG. 18 is a cross-sectional view of a display device according to still another embodiment.

FIG. 18 is a cross-sectional view of a display device according to still another embodiment.

Referring to FIG. 18, it is different from the optical path adjustment film 200 according to FIG. 6 in that an optical path adjustment film 200_1 of the display device according to the present embodiment does not include a support portion. The protruding pattern 231 may be disposed on (e.g., directly disposed on) the encapsulation member 190. As shown in FIG. 18, a plurality of protruding patterns 231 may be disposed on (e.g., directly disposed on) the encapsulation member 190. The optical path adjustment film 200_1 according to the present embodiment may be formed by a method of forming a pattern portion material layer only on the corresponding concave pattern (e.g., a slit coating method) after pressing the material layer of the cover layer by using a stamper to form a concave pattern corresponding to the protruding pattern 231 in the material layer of the cover layer through a protrusion portion of the stamper.

Figure 19:
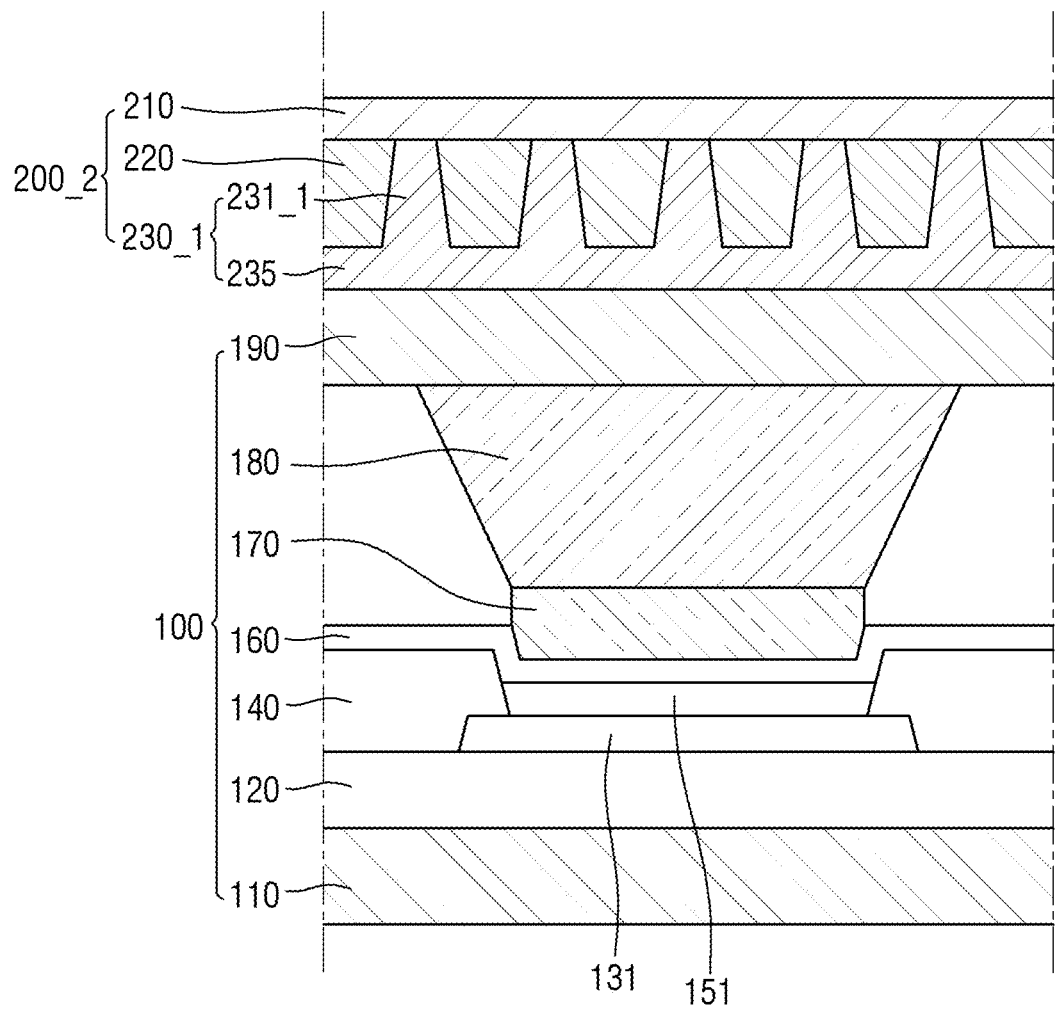
FIG. 19 is a cross-sectional view of a display device according to yet another embodiment.

FIG. 19 is a cross-sectional view of a display device according to yet another embodiment.

Referring to FIG. 19, an optical path adjustment film 200_2 of the display device according to the present embodiment is different from the optical path adjustment film 200 according to FIG. 6 in that an upper surface of a protruding pattern 231_1 may be in direct contact with a lower surface of the optical path adjustment substrate 210.

According to the optical path adjustment film 200_2, because the protruding pattern 231_1 is formed in a manner that penetrates (e.g., completely penetrates) a cover layer 220_1, it is not necessary to increase a thickness of the cover layer 220_1 in order to secure a sufficient thickness of the protruding pattern 231, and thus there is an advantage that the overall thickness of the optical path adjustment film 200_2 may be reduced.

Figure 20:
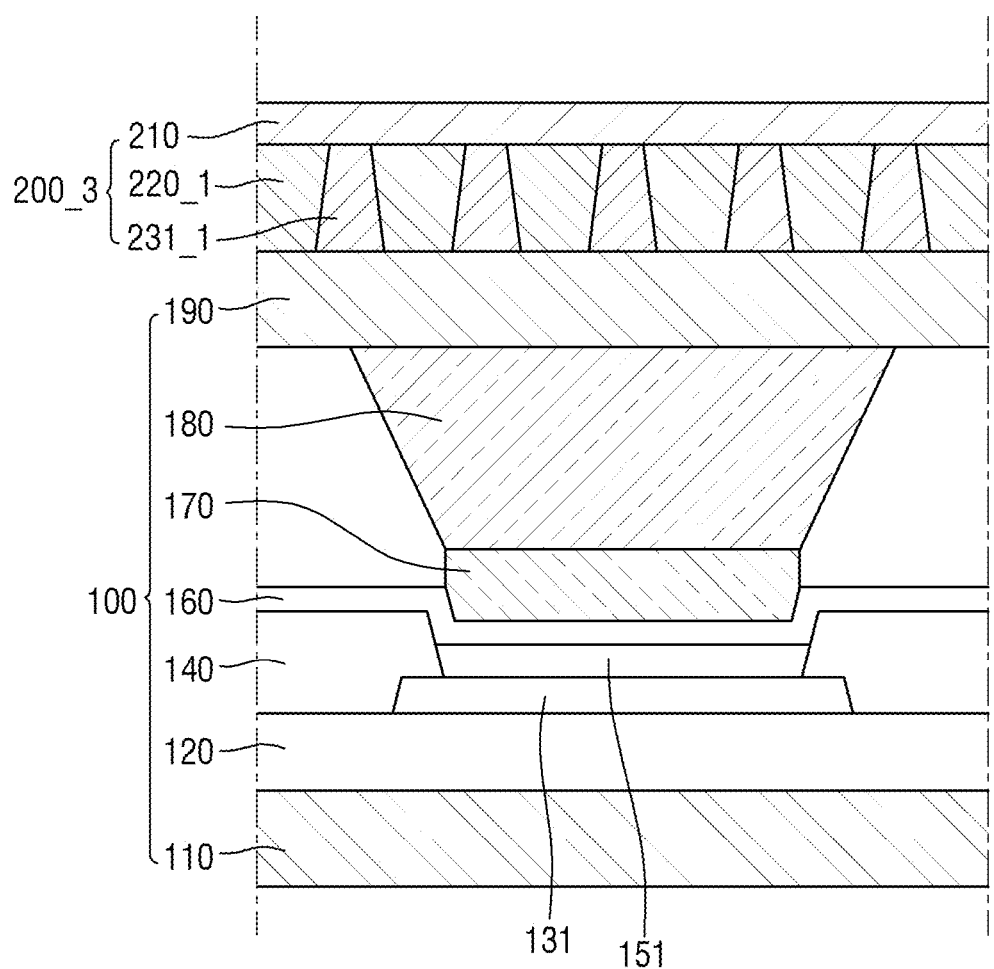
FIG. 20 is a cross-sectional view of a display device according to yet another embodiment.

FIG. 20 is a cross-sectional view of a display device according to yet another embodiment.

Referring to FIG. 20, an optical path adjustment film 200_3 of the display device according to the present embodiment is different from the optical path adjustment film 200_2 of FIG. 19 in that a support portion may be additionally omitted. Each of a lower surface of the cover layer 220_1 and a lower surface of the protruding pattern 231_1 may be in contact with an upper surface of the encapsulation member 190.

Figure 21:
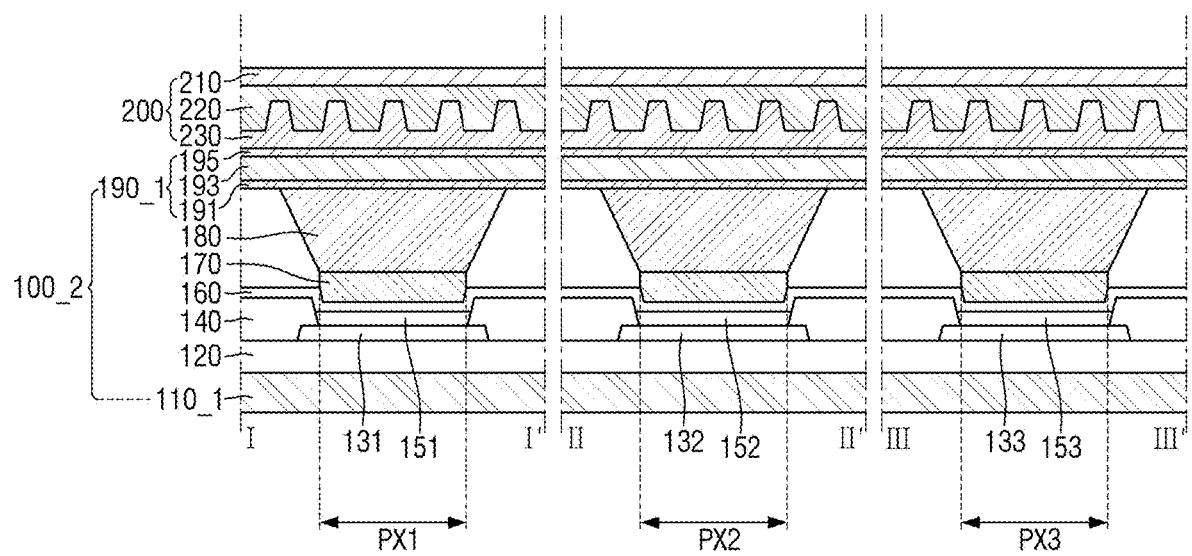
FIG. 21 is a set of cross-sectional views taken along the lines I-I', II-II', and III-III' of FIG. 3 according to yet another embodiment.
Figure 22:
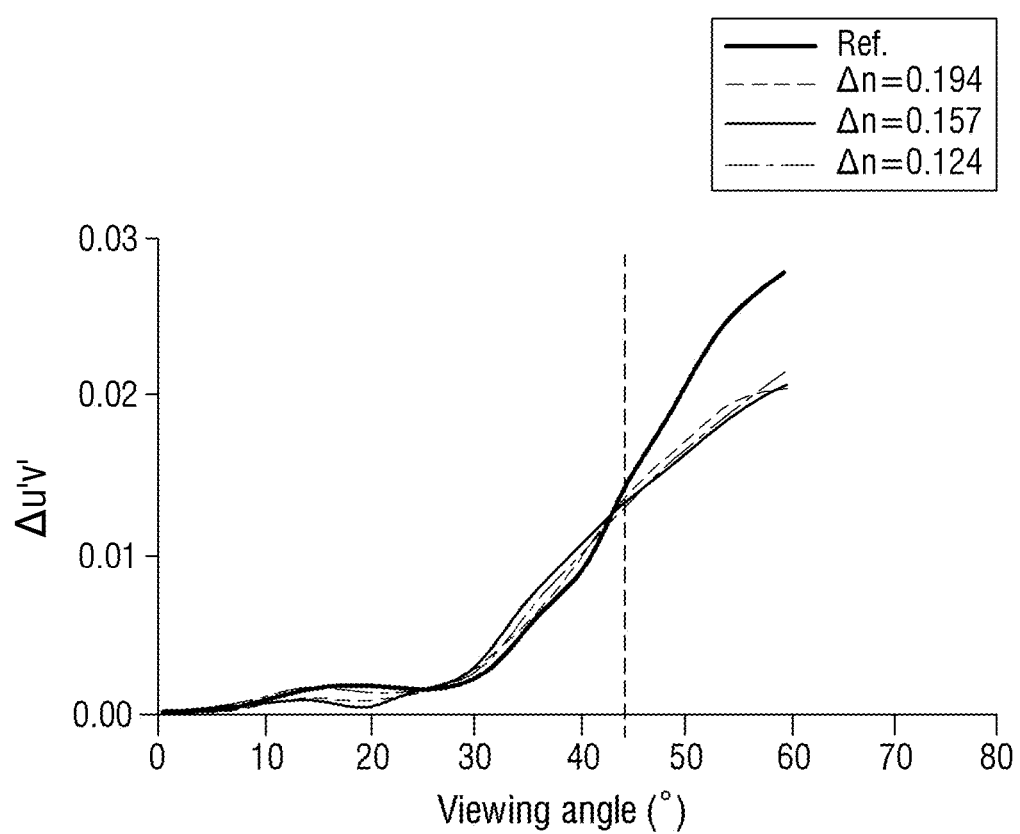
FIG. 22 is a graph showing a correlation between a viewing angle and a color coordinate change amount Δu'v' for each difference in refractive index between a protruding pattern and a cover layer when an inclination angle of the protruding pattern is 88°.
Figure 23:
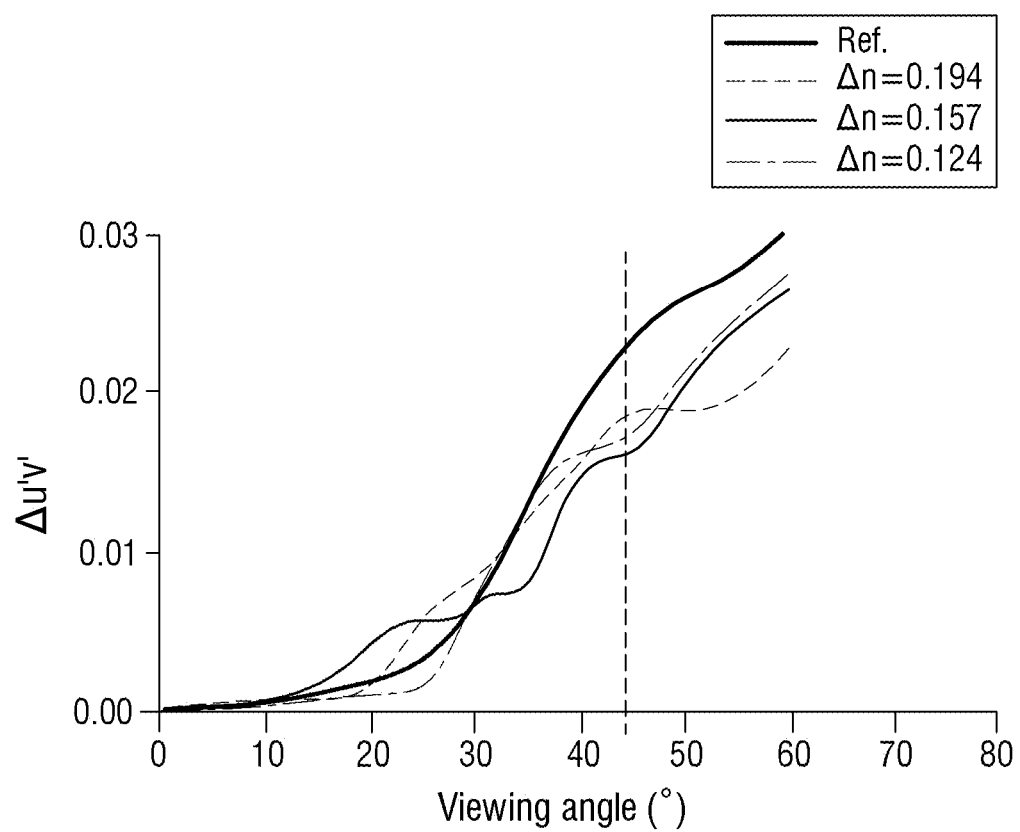
FIG. 23 is a graph showing a correlation between a viewing angle and a color coordinate change amount Δu'v' for each difference in refractive index between the protruding pattern and the cover layer when the inclination angle of the protruding pattern is 85°.
Figure 24:
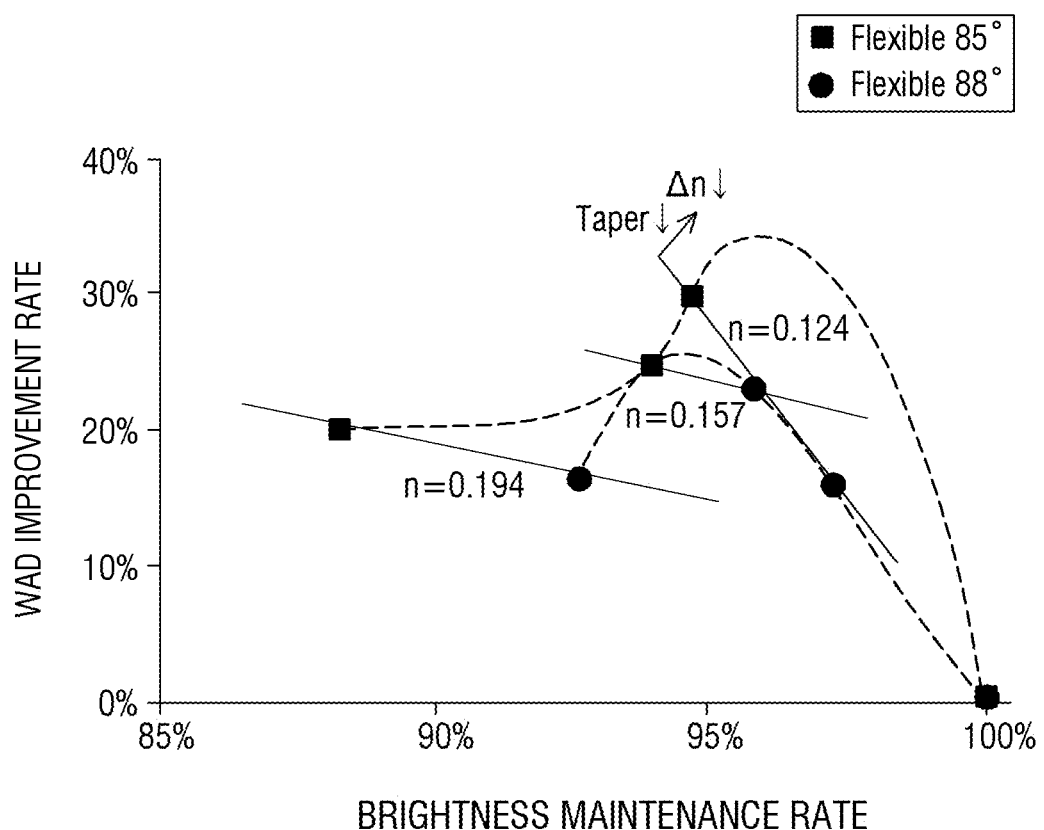
FIG. 24 is a graph showing a brightness maintenance rate according to the difference in refractive index between the protruding pattern and the cover layer and an improvement rate in color change according to the viewing angle for each of the inclination angles 85° and 88° of the protruding pattern.

FIG. 21 is a set of cross-sectional views taken along the lines I-I', II-II', and III-III' of FIG. 3 according to yet another embodiment. FIG. 22 is a graph showing a correlation between a viewing angle and a color coordinate change amount Δu'v' for each difference in refractive index between the protruding pattern and the cover layer when the inclination angle of the protruding pattern is 88°. FIG. 23 is a graph showing a correlation between a viewing angle and a color coordinate change amount Δu'v' for each difference in refractive index between the protruding pattern and the cover layer when the inclination angle of the protruding pattern is 85°. FIG. 24 is a graph showing a brightness maintenance rate according to the difference in refractive index between the protruding pattern and the cover layer and an improvement rate in color change according to the viewing angle for each of the inclination angles 85° and 88° of the protruding pattern.

Referring to FIGS. 21-24, a display panel 100_2 of the display device according to the present embodiment is different from the display device according to FIG. 4 in that a flexible substrate is applied as a substrate 110_1, and a thin film encapsulation layer is applied as an encapsulation member 190_1. The encapsulation member 190_1 may include a first inorganic encapsulation layer 191 disposed on the high-refractive lens 180, an organic encapsulation layer 193 disposed on the first inorganic encapsulation layer 191, and a second inorganic encapsulation layer 195 disposed on the organic encapsulation layer 193. The inorganic encapsulation layers 191 and 195 may contain an inorganic insulating material, and the organic encapsulation layer 193 may contain an organic insulating material.

An upper surface of the high-refractive lens 180 may be in direct contact with the first inorganic encapsulation layer 191. The optical path adjustment film 200 may be disposed on (e.g., directly disposed on) the second inorganic encapsulation layer 195.

Referring to FIG. 22 along with FIG. 21, after preparing a display device sample (Ref) to which the optical path adjustment film 200 is not applied, a display device sample (Δn=0.194) having a difference in refractive index between the protruding pattern 231 and the cover layer 220 of 0.194, a display device sample (Δn=0.157) having a difference in refractive index between the protruding pattern 231 and the cover layer 220 of 0.157, and a display device sample (Δn=0.124) having a difference in refractive index between the protruding pattern 231 and the cover layer 220 of 0.124, a color coordinate change amount (Δu'v') was measured for each sample while changing the viewing angle. A thin film encapsulation layer was applied as the encapsulation member for the corresponding samples of FIG. 13. The inclination angle of the protruding pattern 231 of each sample to which the optical path adjustment film 200 is applied is 88°. As confirmed in FIG. 22, each sample shows no significant difference in color coordinate change amount Δu'v' until the viewing angle is around 45°, but in the display device sample (Ref) to which the optical path adjustment film 200 is not applied compared to the samples to which the optical path adjustment film 200 is applied, the color coordinate change amount Δu'v' increases (e.g., increases significantly) when the viewing angle is 45° or more.

Referring to FIG. 23 along with FIG. 21, unlike FIG. 22, the inclination angle of the protruding pattern 231 of each sample to which the optical path adjustment film 200 is applied is 85°. Because the rest of the description is the same, a redundant description thereof may not be repeated.

Referring to FIG. 24, the front brightness maintenance rate (%) and the improvement rate in color change (%) were measured for the display device sample (Δn=0.194) having a difference in refractive index between the protruding pattern 231 and the cover layer 220 of 0.194, the display device sample (Δn=0.157) having a difference in refractive index between the protruding pattern 231 and the cover layer 220 of 0.157, and the display device sample (Δn=0.124) having a difference in refractive index between the protruding pattern 231 and the cover layer 220 of 0.124 in which the second inclination angle $\theta_{t2}$ of the protruding pattern 231 described in FIGS. 22 and 23 is 85°, and the display device sample (Δn=0.194) having a difference in refractive index between the protruding pattern 231 and the cover layer 220 of 0.194, the display device sample (Δn=0.157) having a difference in refractive index between the protruding pattern 231 and the cover layer 220 of 0.157, and the display device sample (Δn=0.124) having a difference in refractive index between the protruding pattern 231 and the cover layer 220 of 0.124 in which the second inclination angle $\theta_{t2}$ of the protruding pattern 231 is 88°.

As confirmed in FIG. 24, according to each display device sample, the improvement rate in color change (%) is improved, but the front brightness maintenance rate (%) decreases (e.g., gradually decreases) as the difference in refractive index between the protruding pattern 231 and the cover layer 220 increases. As the difference in refractive index between the protruding pattern 231 and the cover layer 220 increases, the total reflection ratio at an outer surface of the cover layer 220 increases, and thus it is considered that the color change according to the viewing angle is improved and the front brightness maintenance rate is reduced.

However, in the display device according to the present embodiment, the improvement rate in color change (%) is improved through the optical path adjustment film 200, and the reduction in front brightness maintenance rate caused by the refractive index of the cover layer 220 is compensated for by the high-refractive lens 180 described above, and as a result, there is an advantage of reducing the color change according to the viewing angle and increasing the front light emission efficiency.

According to one or more embodiments, a display device capable of improving light emission efficiency and reducing a color change according to a viewing angle can be provided.

Effects according to the present embodiments are not limited by the contents illustrated above, and more effects are included in the present specification.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims, and equivalents thereof.

What is claimed is:

1. A display device comprising:
 a display panel; and
 an optical path adjustment film on the display panel,
 wherein the display panel comprises:
    a substrate;
    a first electrode on the substrate;
    a bank layer on the first electrode and partially exposing an upper surface of the first electrode;
    light-emitting layer on the upper surface of the first electrode exposed by the bank layer;
    a second electrode on the light-emitting layer and the bank layer;
    a high-refractive lens on the second electrode and having a refractive index higher than a refractive index of a material that overlaps the first electrode in a thickness direction of the display device and contacts a side surface of the high-refractive lens; and
    an encapsulation member that faces the substrate, is on the high-refractive lens, and seals the light-emitting layer;
 wherein the optical path adjustment film comprises;
    a plurality of protruding patterns on the encapsulation member; and
    a cover layer in spaces between adjacent protruding patterns from among the plurality of protruding patterns, and
    wherein a refractive index of each of the protruding patterns is smaller than a refractive index of the cover layer.

2. The display device of claim 1, wherein the high-refractive lens comprises a lower surface, an upper surface closer to the encapsulation member than the lower surface, and the side surface connecting the lower surface and the upper surface,
 wherein a width of the upper surface of the high-refractive lens is larger than a width of the lower surface of the high-refractive lens, and
 wherein the side surface of the high-refractive lens is inclined downward.

3. The display device of claim 2, wherein the refractive index of the high-refractive lens is 1.4 to 2.0.

4. The display device of claim 3, wherein an inclination angle formed by the upper surface and the side surface of the high-refractive lens is 44° to 60°.

5. The display device of claim 4, wherein the material contacting the side surface of the high-refractive lens is air.

6. The display device of claim 2, wherein the high-refractive lens comprises high refractive curable polysilicon.

7. The display device of claim 2, wherein a thickness from the upper surface of the high-refractive lens to the lower surface of the high-refractive lens is 1 μm to 30 μm.

8. The display device of claim 2, wherein a cross-sectional shape of the high-refractive lens comprises an inverted trapezoidal shape.

9. The display device of claim 1, wherein a planar shape of the upper surface of the first electrode exposed by the bank layer is the same as a planar shape of the high-refractive lens.

10. The display device of claim 1, wherein the plurality of protruding patterns comprise a protruding pattern comprising an upper surface, a lower surface closer to the encapsulation member than the upper surface, and a side surface connecting the upper surface and the lower surface,
 wherein a width of the upper surface of the protruding pattern is smaller than a width of the lower surface of the protruding pattern, and
 wherein the side surface of the protruding pattern is inclined downward.

11. The display device of claim 10, wherein the cover layer is in direct contact with the upper surface of the protruding pattern and the side surface of the protruding pattern.

12. The display device of claim 11, wherein a difference between the refractive index of the cover layer and the refractive index of the protruding pattern is 0.12 to 0.2.

13. The display device of claim 12, wherein the width of the upper surface of the protruding pattern is 5 μm to 7 μm, and
 wherein a pitch of the adjacent protruding patterns is 10 μm to 30 μm.

14. The display device of claim 13, wherein a randomness of the pitch of the plurality of protruding patterns is 20% to 50%.

15. The display device of claim 12, wherein a ratio of the width of the upper surface of the protruding pattern and a thickness from the upper surface of the protruding pattern to the lower surface of the protruding pattern is 1.0 to 1.5.

16. The display device of claim 12, wherein an inclination angle formed by the lower surface of the protruding pattern and the side surface of the protruding pattern is 80° to 89°.

17. A display device comprising:
a display panel; and
an optical path adjustment film on the display panel, wherein the display panel comprises:
   a substrate;
   a first electrode on the substrate;
   a bank layer on the first electrode and partially exposing an upper surface of the first electrode to define a pixel area;
   light-emitting layer on the first electrode in the pixel area;
   a second electrode on the light-emitting layer and the bank layer;
   a high-refractive lens on the second electrode and having a refractive index higher than a refractive index of a material that overlaps the first electrode in a thickness direction of the display device and contacts a side surface of the high-refractive lens; and
   an encapsulation member that faces the substrate, is on the high-refractive lens, and comprises a glass sealing the light-emitting layer, and
wherein the optical path adjustment film comprises:
   plurality of protruding patterns on the encapsulation member; and
   a cover layer that is in a space between adjacent protruding patterns from among the plurality of protruding patterns and has a refractive index greater than a refractive index of each of the protruding patterns, and
wherein the high-refractive lens overlaps at least two protruding patterns of the plurality of protruding patterns in the thickness direction.

18. The display device of claim 17, wherein the high-refractive lens comprises a lower surface, an upper surface closer to the encapsulation member than the lower surface, and the side surface connecting the lower surface and the upper surface,
   wherein a width of the upper surface of the high-refractive lens is larger than a width of the lower surface of the high-refractive lens,
   wherein the side surface of the high-refractive lens is inclined downward,
   wherein the refractive index of the high-refractive lens is 1.4 to 2.0,
   wherein an inclination angle formed by the upper surface of the high-refractive lens and the side surface of the high-refractive lens is 44° to 60°, and
   wherein the material contacting the side surface of the high-refractive lens is air.

19. The display device of claim 18, wherein the plurality of protruding patterns comprise a protruding pattern comprising an upper surface, a lower surface closer to the encapsulation member than the upper surface, and a side surface connecting the upper surface and the lower surface,
   wherein a width of the upper surface of the protruding pattern is smaller than a width of the lower surface of the protruding pattern,
   wherein the side surface of the protruding pattern is inclined downward,
   wherein the cover layer is in direct contact with the upper surface of the protruding pattern and the side surface of the protruding pattern, and
   wherein a difference between the refractive index of the cover layer and the refractive index of the protruding pattern is 0.12 to 0.2.

20. The display device of claim 19, wherein the plurality of protruding patterns are configured to laterally guide light generated from the light-emitting layer in the pixel area.

* * * * *